US011562957B2

(12) United States Patent
Kuwabara et al.

(10) Patent No.: US 11,562,957 B2
(45) Date of Patent: *Jan. 24, 2023

(54) SEMICONDUCTOR DEVICE AND METHOD OF MANUFACTURING THE SAME

(71) Applicant: RENESAS ELECTRONICS CORPORATION, Tokyo (JP)

(72) Inventors: Shinichi Kuwabara, Ibaraki (JP); Yasutaka Nakashiba, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/190,916

(22) Filed: Mar. 3, 2021

(65) Prior Publication Data

US 2021/0343641 A1 Nov. 4, 2021

(30) Foreign Application Priority Data

Apr. 30, 2020 (JP) .............................. JP2020-080037

(51) Int. Cl.
*H01L 23/522* (2006.01)
*H01L 23/64* (2006.01)
(Continued)

(52) U.S. Cl.
CPC .......... *H01L 23/5227* (2013.01); *H01L 21/56* (2013.01); *H01L 21/743* (2013.01);
(Continued)

(58) Field of Classification Search
CPC ................. H01L 23/5227; H01L 28/10; H01L 25/07–074; H01L 25/11–117;
(Continued)

(56) References Cited

U.S. PATENT DOCUMENTS 5,422,615 A * 6/1995 Shibagaki ............... H01L 23/66
333/33
7,741,148 B1 * 6/2010 Marimuthu ......... H01L 23/3121
438/106
(Continued)

FOREIGN PATENT DOCUMENTS

JP 06-310591 A 11/1994
JP 2004-071997 A 3/2004
(Continued)

OTHER PUBLICATIONS

Japanese Notice of Reasons for Refusal issued in corresponding Japanese Patent Application No. 2019-117576, dated Sep. 6, 2022, with English translation.

*Primary Examiner* — Mary A Wilczewski
*Assistant Examiner* — Tsz K Chiu
(74) *Attorney, Agent, or Firm* — McDermott Will & Emery LLP

(57) ABSTRACT

A semiconductor device has a first area in which first and third semiconductor elements are formed, a second area in which second and fourth semiconductor elements are formed, and a third area located between the first and second areas. On the first to fourth semiconductor elements, a multilayer wiring layer including first and second inductors is formed. A through hole penetrating the semiconductor substrate is formed in the third area, and a first element isolation portion protruding from a front surface side of the semiconductor substrate toward a back surface side of the semiconductor substrate is formed in the through hole. Further, on the back surface side of the semiconductor substrate, the semiconductor substrate in the first area is mounted on the first die pad, and the semiconductor substrate in the second area is mounted on the second die pad.

20 Claims, 13 Drawing Sheets

(51) Int. Cl.
  *H01L 23/31* (2006.01)
  *H01L 23/495* (2006.01)
  *H01L 21/762* (2006.01)
  *H01L 21/74* (2006.01)
  *H01L 49/02* (2006.01)
  *H01L 21/56* (2006.01)
  *H01L 21/8234* (2006.01)
  *H01L 23/00* (2006.01)

(52) U.S. Cl.
  CPC .... *H01L 21/762* (2013.01); *H01L 21/823481* (2013.01); *H01L 23/3107* (2013.01); *H01L 23/49503* (2013.01); *H01L 23/5226* (2013.01); *H01L 28/10* (2013.01); *H01L 24/48* (2013.01); *H01L 2224/4813* (2013.01); *H01L 2224/48257* (2013.01)

(58) Field of Classification Search
  CPC ............. H01L 25/16–167; H01L 25/18; H01L 21/76224–76237; H01L 21/823481; H01L 21/823878
  See application file for complete search history.

(56) References Cited

U.S. PATENT DOCUMENTS

| | | | |
|---|---|---|---|
| 8,004,062 B2* | 8/2011 | Nakashiba | H01L 23/5227 257/532 |
| 8,378,470 B2 | 2/2013 | Nakashiba et al. | |
| 9,871,036 B2 | 1/2018 | Nakashiba et al. | |
| 11,049,820 B2* | 6/2021 | Stewart | H01L 28/10 |
| 2002/0070439 A1* | 6/2002 | Hiramatsu | H01L 23/293 257/789 |
| 2002/0132414 A1* | 9/2002 | Lung | H01L 27/11546 257/E27.081 |
| 2005/0213280 A1* | 9/2005 | Azrai | H01L 24/05 361/271 |
| 2006/0105496 A1* | 5/2006 | Chen | H01L 24/05 257/E21.597 |
| 2007/0077747 A1* | 4/2007 | Heck | H01L 24/97 257/E23.008 |
| 2011/0012199 A1* | 1/2011 | Nygaard | H01L 21/84 257/E23.101 |
| 2011/0266649 A1* | 11/2011 | Nakashiba | H01L 23/5227 257/E29.325 |
| 2013/0175636 A1* | 7/2013 | Nakashiba | H01L 27/0617 257/379 |
| 2014/0035158 A1* | 2/2014 | Chang | H01L 25/50 438/109 |
| 2014/0175602 A1* | 6/2014 | Funaya | H01L 23/49575 438/381 |
| 2014/0264722 A1* | 9/2014 | Nakashiba | H01L 23/5227 257/506 |
| 2015/0035116 A1* | 2/2015 | Nakashiba | H01L 23/528 257/531 |
| 2015/0179572 A1* | 6/2015 | Nakashiba | H01L 23/528 257/531 |
| 2016/0093570 A1* | 3/2016 | Watanabe | H01L 23/3107 257/531 |
| 2018/0102360 A1* | 4/2018 | Nakashiba | H01L 23/5227 |
| 2018/0122719 A1* | 5/2018 | Kwak | H01L 35/32 |
| 2018/0197950 A1* | 7/2018 | Natsume | H01L 21/76224 |
| 2018/0277518 A1* | 9/2018 | Iida | H01L 23/3107 |
| 2019/0371727 A1* | 12/2019 | Kuwabara | H01L 28/10 |
| 2020/0168545 A1* | 5/2020 | Uchida | H01L 24/46 |
| 2020/0411434 A1* | 12/2020 | Nakas | H01L 21/56 |
| 2021/0151394 A1* | 5/2021 | Uchida | H01L 23/645 |

FOREIGN PATENT DOCUMENTS

| | | |
|---|---|---|
| JP | 2011-054800 A | 3/2011 |
| JP | 2014-183071 A | 9/2014 |
| JP | 2017-507494 A | 3/2017 |
| WO | 2015/128479 A1 | 9/2015 |

\* cited by examiner

11,562,957 B2

SEMICONDUCTOR DEVICE AND METHOD OF MANUFACTURING THE SAME

CROSS-REFERENCE TO RELATED APPLICATIONS

The present application claims priority from Japanese Patent Application No. 2020-080037 filed on Apr. 30, 2020 the content of which is hereby incorporated by reference to this application.

TECHNICAL FIELD

The present invention relates to a semiconductor device and its manufacturing method, for example, a semiconductor device having an inductor and its manufacturing method.

BACKGROUND

In recent years, developed has been a technique in which an inductor is mounted on each of two semiconductor chips and a signal is transmitted and received between these two inductors in a non-contact manner. A device provided with such two inductors and a transmitter/receiver circuit is called a digital isolator.

For example, Patent Document 1 (Japanese Patent Application Laid-open No. 2011-54800) discloses a semiconductor device in which a first semiconductor chip and a second semiconductor chip are laminated so that the first inductor formed on a first semiconductor chip and the second inductor formed on a second semiconductor chip are opposed to each other. A first semiconductor element formed on the first semiconductor chip and a second semiconductor element formed on the second semiconductor chip can transmit a signal to each other by electromagnetic induction coupling via a first inductor and a second inductor.

SUMMARY

However, since the semiconductor device of Patent Document 1 is manufactured by assembling the two semiconductor chips, there arises a problem of making it difficult to promote miniaturization of a semiconductor device as compared with a case where two inductors are formed on one semiconductor chip.

A main problem in the present application is to promote the miniaturization of the semiconductor device. Other problems and novel features will become apparent from the description and accompanying drawings.

Among embodiments disclosed in the present application, a brief outline of typical one is as follows.

A semiconductor device according to an embodiment has: a first area in which a first semiconductor element is formed; a second area in which a second semiconductor element is formed; and a third area located between the first and second areas. Further, the semiconductor device includes: a semiconductor substrate; the first semiconductor element formed on a front surface side of the semiconductor substrate in the first area; the second semiconductor element formed on the front surface side of the semiconductor substrate in the second area and driven at a voltage higher than that of the first semiconductor element. Additionally, the semiconductor device includes: a multilayer wiring layer; a first inductor formed in the multilayer wiring layer and electrically connected to the first semiconductor element; and a second inductor formed in a wiring layer different from that of the first inductor in the multilayer wiring layer and electrically connected to the second semiconductor element. Here, a through hole penetrating the semiconductor substrate is formed in the third area, and a first element isolation portion is formed in the through hole so as to project from the front surface side of the semiconductor substrate toward a back surface side of the semiconductor substrate. Further, on the back surface side of the semiconductor substrate, the semiconductor substrate in the first area is mounted on the first die pad, and the semiconductor substrate in the second area is mounted on the second die pad. Furthermore, the semiconductor substrate in the first area conducts with the first die pad, and the semiconductor substrate in the second area conducts with the second die pad. Additionally, sealed with a mold resin are: the semiconductor substrate including the through hole; and the multilayer wiring layer including the first and second inductors; and the first and second die pads.

A manufacturing method of a semiconductor device according to an embodiment includes: forming, in the semiconductor substrate, a first element isolation portion projecting from a front surface side of the semiconductor substrate toward a back surface side of the semiconductor substrate; forming a first semiconductor element on a front surface side of the semiconductor substrate in a first area; and forming a second semiconductor element on the front surface side of the semiconductor substrate in a second area, the second semiconductor element being driven by a voltage higher than that of the first semiconductor element. Further, the manufacturing method of a semiconductor device includes: forming a multilayer wiring layer including a first inductor and a second inductor; forming a through hole penetrating the semiconductor substrate so that the first element isolation portion is exposed; on the back surface side of the semiconductor substrate, mounting the semiconductor substrate in the first area on the first die pad so that the semiconductor substrate in the first area conducts with the first die pad, and mounting the semiconductor substrate in the second area on the second die pad so that the semiconductor substrate in the second area conducts with the second die pad; and sealing, with a mold resin, the semiconductor substrate, and the multilayer wiring layer, and the first and second die pads.

According to one embodiment, the miniaturization of the semiconductor device can be promoted.

DETAILED DESCRIPTION

Figure 1:
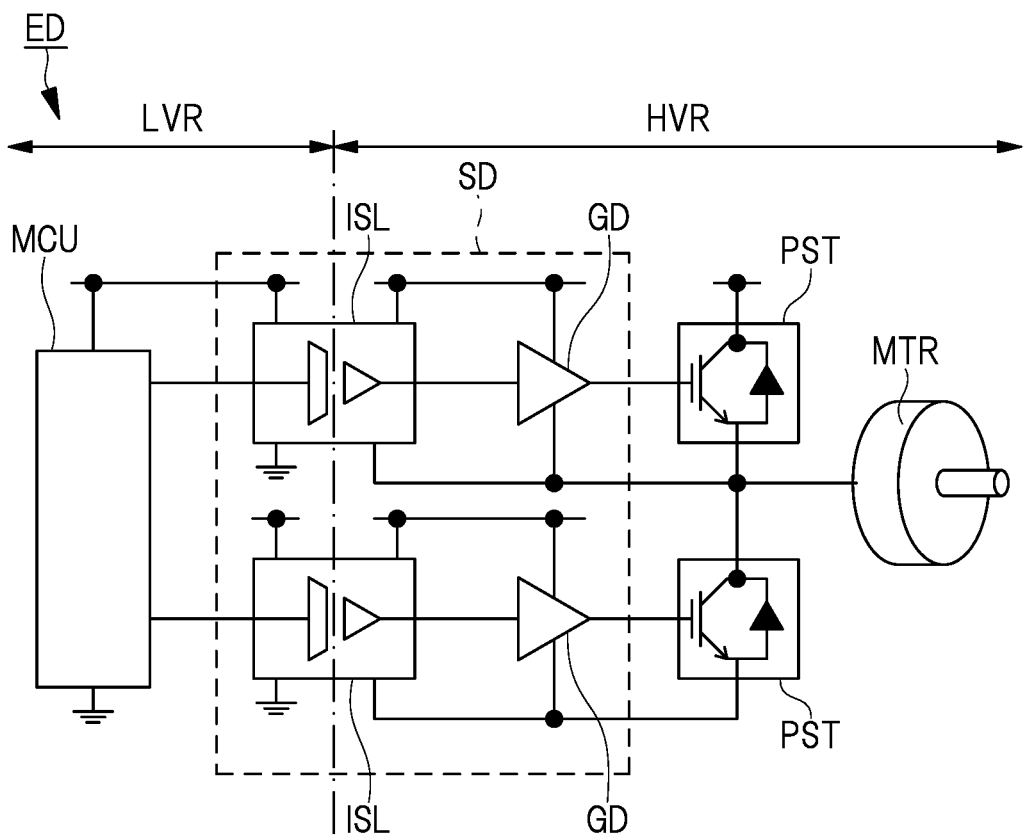
FIG. 1 is a circuit diagram showing an electronic device using a semiconductor device according to a first embodiment.

Hereinafter, embodiments will be described in detail with reference to the drawings. Incidentally, in all the drawings for explaining embodiments, members having the same function are denoted by the same reference numerals, and a repetitive description thereof will be omitted. Further, in the following embodiments, the description of the same or similar parts is not repeated in principle except when it is particularly necessary.

Further, in the drawings for explaining the embodiments, in order to make their configurations easy to understand, hatching may be added even in the plan views, or hatching may be omitted even in the sectional views.

Further, the X direction, the Y direction, and the Z direction described in the embodiments intersect (orthogonally) with each other. In the present application, the Z direction is described as a vertical direction, a height direction, or a thickness direction of a certain structure. Further, a face (surface) formed by the X direction and the Y direction forms a plane, which is a plane perpendicular to the Z direction. For example, when the term "plan view" is used in the present application, it means that a face composed of the X and Y directions is viewed from the Z direction.

First Embodiment

<Configuration of Electronic Device ED>

FIG. 1 is a circuit diagram showing an example of the configuration of an electronic device ED using a semiconductor device SD according to a first embodiment.

As shown in FIG. 1, an electronic device ED includes a microcomputer unit MCU, a semiconductor device SD, a power semiconductor element PST, and a motor MTR. The power semiconductor element PST is composed of, for example, an IGBT. Further, the semiconductor device SD has a digital isolator ISL and a gate driver circuit GD. In the electronic device ED and the semiconductor device SD, the number of respective components is not particularly limited, and may be one or more.

In the electronic device ED, for example, a signal for driving the motor MTR is transmitted from the microcomputer unit MCU to the gate driver circuit GD. At this time, the digital isolator ISL is arranged between a high voltage region HVR and a low voltage region LVR. The digital isolator ISL transmits a signal between the high voltage region HVR and the low voltage region LVR. More specifically, in the digital isolator ISL, a signal is transmitted by inductive coupling via two inductors IND1 and IND2 described later. Consequently, the signal is transmitted in a state where the microcomputer MCU driven by a low voltage and the gate driver circuit GD driven by a high voltage are electrically isolated from each other.

<Configuration of Semiconductor Device SD>

Hereinafter, the semiconductor device (semiconductor chip) SD according to the first embodiment will be described with reference to FIGS. 2 to 6.

Figure 2:
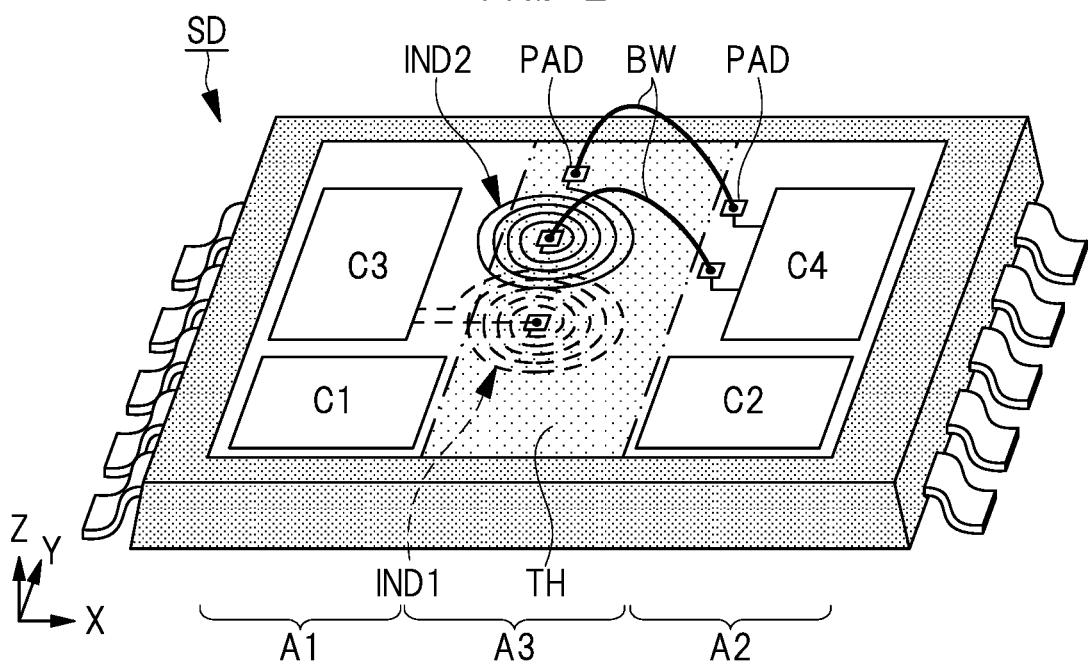
FIG. 2 is a perspective view showing an outline of the semiconductor device according to the first embodiment.
Figure 3:
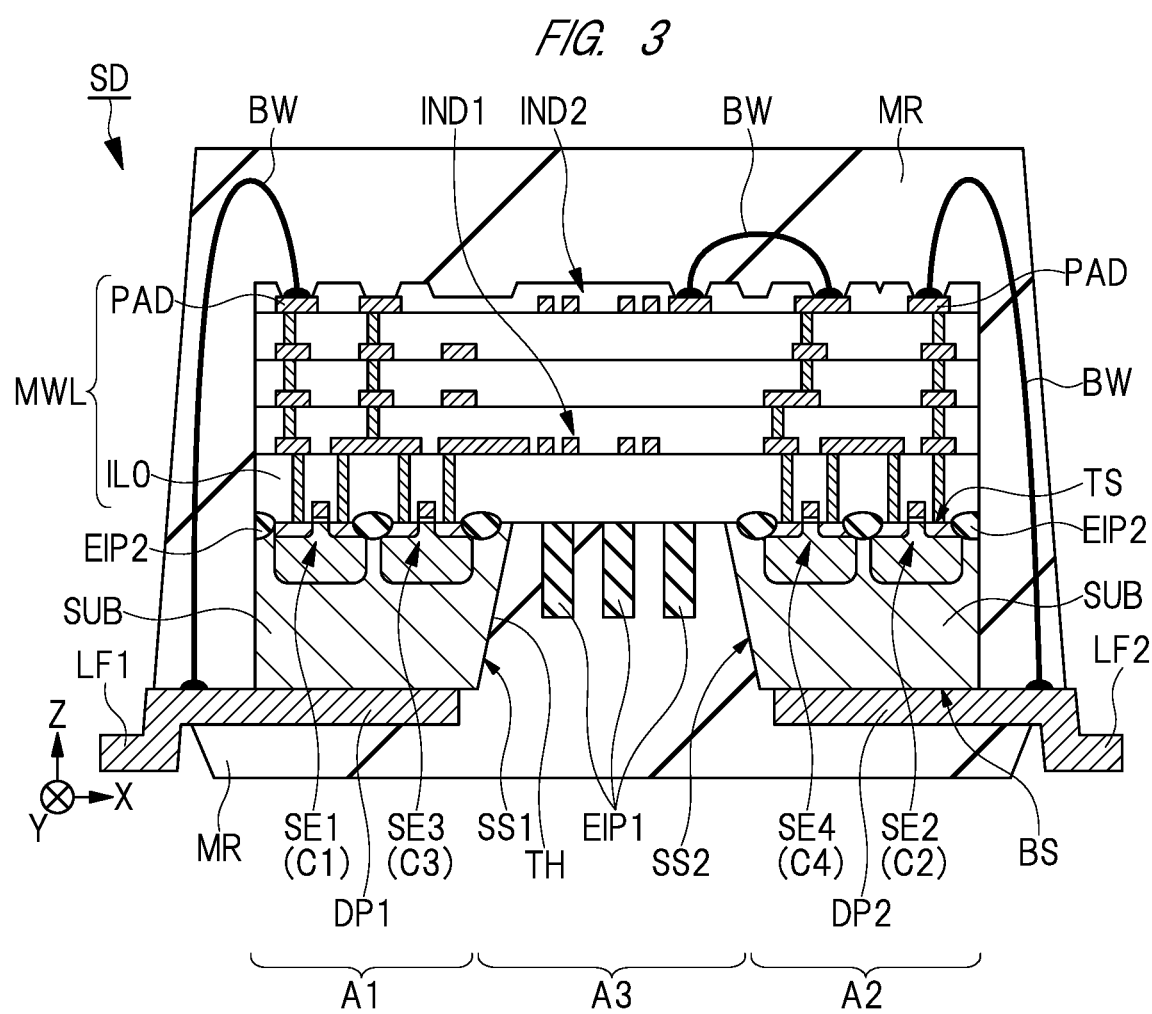
FIG. 3 is a sectional view showing the semiconductor device according to the first embodiment.
Figure 4:
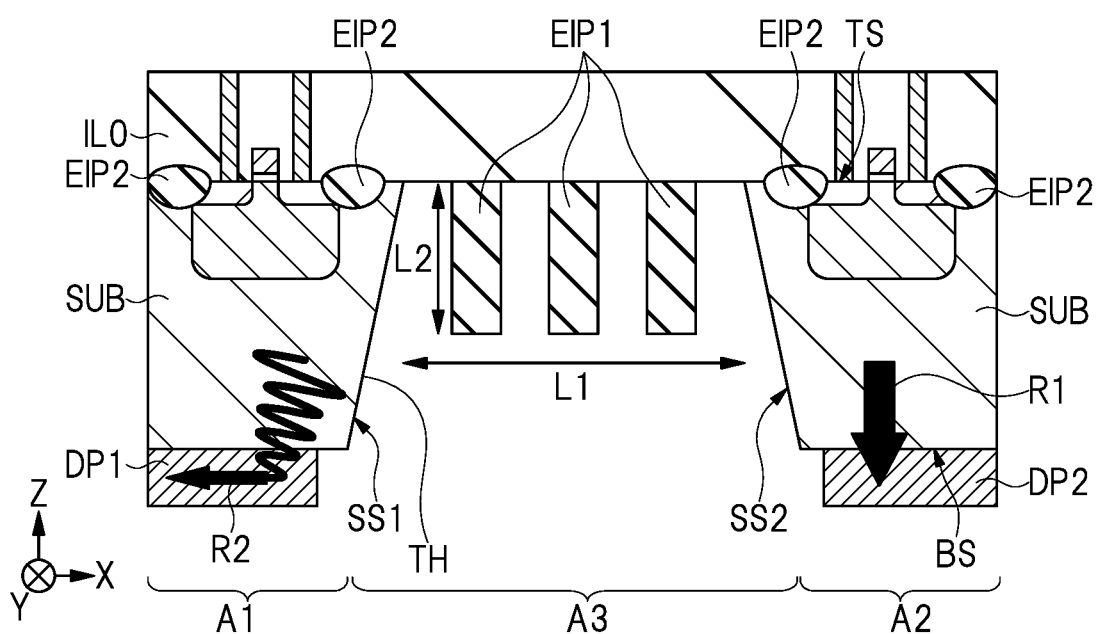
FIG. 4 is a sectional view of a main part of the semiconductor device according to the first embodiment.
Figure 5:
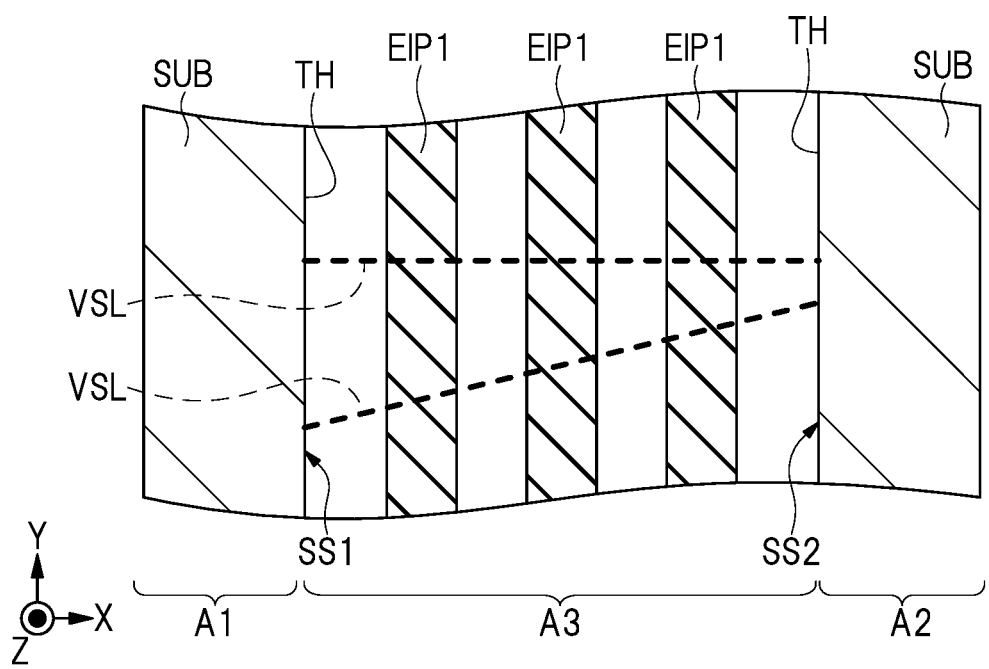
FIG. 5 is a plan view showing a periphery of each of through holes in the first embodiment.
Figure 6:
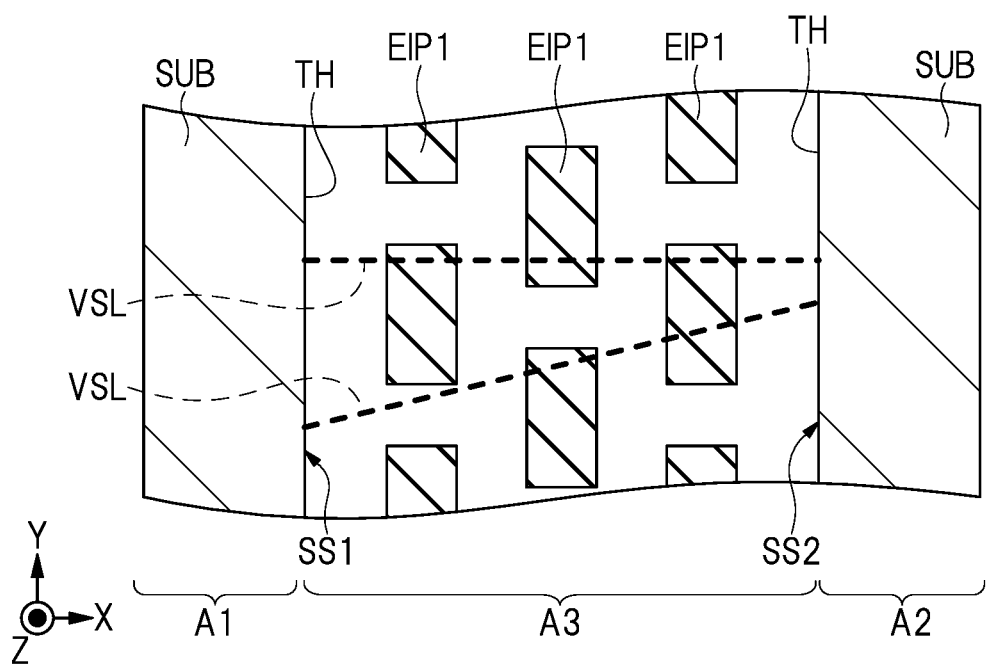
FIG. 6 is a plan view showing the periphery of the through hole in the first embodiment.

FIG. 2 is a perspective view showing the semiconductor device SD according to the first embodiment. However, in FIG. 2, some components of the semiconductor device SD are perspective, and a positional relationship among the respective components is shown schematically. FIG. 3 is a sectional view showing the semiconductor device SD. FIG. 4 is a sectional view of a partially enlarged main portion of FIG. 3. FIGS. 5 and 6 are plan views each showing a periphery of each through hole TH.

As shown in FIG. 2, the semiconductor device SD includes an inductor IND1, an inductor IND2, a controller circuit C1, a gate driver circuit C2, a transmission/reception circuit C3, and a transmission/reception circuit C4. The digital isolator ISL shown in FIG. 1 includes the inductor IND1, the inductor IND2, the controller circuit C1, the transmission/reception circuits C3, and the transmission/reception circuit C4, and the gate driver circuit GD shown in FIG. 1 corresponds to the gate driver circuit C2.

The inductor IND1 is electrically connected to the transmission/reception circuit C3 via a multilayer wiring layer MWL inside the semiconductor device SD. The inductor IND2 is electrically connected to the transmission/reception circuit C4 via a pad electrode PAD located at the uppermost layer of the multilayer wiring layer MWL and a bonding wire BW connected to the pad electrode PAD. When the transmission/reception circuit C3 functions as a reception circuit, the transmission/reception circuit C4 functions as a transmission circuit. Further, when the transmission/reception circuit C3 functions as a transmission circuit, the transmission/reception circuit C4 functions as a reception circuit.

Further, the semiconductor device SD has: an area A1 in which the controller circuit C1 and the transmission/reception circuit C3 are formed; an area A2 in which the gate driver circuit C2 and the transmission/reception circuit C4 are formed; and an area A3 located between the area A1 and the area A2. In the area A3, a through hole TH penetrating a semiconductor substrate SUB is formed.

As shown in FIGS. 3 and 4, the semiconductor substrate SUB has a front surface TS and a back surface BS opposite to the front surface TS, and is made of a semiconductor material such as silicon. A plurality of p-type well regions and a plurality of n-type well regions are formed on a front surface TS side of the semiconductor substrate SUB. A source region and a drain region are formed in each well region, and a gate electrode is formed on each well region via a gate insulating film.

A semiconductor element SE1 and a semiconductor element SE3 are formed on the front surface TS side of the semiconductor substrate SUB in the area A1, and a semiconductor element SE2 and a semiconductor element SE4 are formed on the front surface TS side of the semiconductor substrate SUB in the area A2. These semiconductor elements SE1 to SE4 each have the gate electrode, the gate insulating film, the source region, and the drain region, and form, for example, a p-type or n-type MISFET (Metal Insulator Semiconductor Field Effect Transistor).

In addition, a plurality of semiconductor elements SE1 to SE4 are formed on the semiconductor substrate SUB. A part of the controller circuit C1 is formed by the plurality of semiconductor elements SE1; a part of the gate driver circuit C2 is formed by the plurality of semiconductor elements SE2; a part of the transmission/reception circuit C3 is formed by the plurality of semiconductor elements SE3; and a part of the transmission/reception circuit C4 is formed by the plurality of semiconductor elements SE4.

Further, since the gate driver circuit C2 is used to drive the motor MTR and the like shown in FIG. 1, the gate driver circuit C2 is required to operate at a high voltage. Therefore, a drive voltage of the semiconductor element SE2 that forms a part of the gate driver circuit C2 is about several hundred V. On the other hand, each drive voltage of the semiconductor elements SE1, SE3, and SE4 is about several V.

Since the semiconductor element SE2 is driven by a higher voltage than the semiconductor elements SE1, SE3, and SE4, the semiconductor element SE2 is configured with a device structure having a higher withstand voltage than those of the semiconductor elements SE1, SE3, and SE4. Although not shown in detail in the drawings of the present application, for example, a thickness of the gate insulating film of the semiconductor element SE2 is thicker than the thickness of the gate insulating film of each of the semiconductor elements SE1, SE3, and SE4.

In the semiconductor substrate SUB in the areas A1 and A2, an element isolation portion EIP2 for mutually isolating (separating) the semiconductor elements SE1 to SE4 is formed. The element isolation portion EIP2 projects from the front surface TS side of the semiconductor substrate SUB toward a back surface BS side of the semiconductor substrate SUB.

In the first embodiment, the element isolation portion EIP2 is an inorganic insulating film, which is a silicon oxide film formed by selectively oxidizing the semiconductor substrate SUB by a thermal oxidation method, and is configured by a so-called LOCOS (Local Oxidation Silicon) structure. Incidentally, the element isolation portion EIP2 may also be formed in the area A3.

A multilayer wiring layer MWL is formed on the semiconductor substrate SUB containing each semiconductor element SE1 to SE4. The multilayer wiring layer MWL includes a plurality of interlayer insulating films, a plurality of wirings formed in each interlayer insulating film, and a plurality of plugs formed in each interlayer insulating film.

In FIG. 3, an interlayer insulating film IL0 is shown as the lowermost interlayer insulating film covering each of the semiconductor elements SE1 to SE4. The interlayer insulating film IL0 is an inorganic insulating film, for example, a silicon oxide film. Further, the interlayer insulating film IL0 may be a laminated film in which a plurality of inorganic insulating films such as silicon nitride films, silicon oxynitride films or silicon oxide films are formed.

The plurality of wirings constituting the multilayer wiring layer MWL include, for example, a conductive film mainly composed of aluminum, and the plurality of plugs constituting the multilayer wiring layer MWL include, for example, a conductive film mainly composed of tungsten. Further, the plurality of wirings and the plurality of plugs may include a conductive film mainly composed of copper, and may be configured by a so-called damascene structure or a dual damascene structure. In the area A1, the semiconductor element SE1 and the semiconductor element SE3 are electrically connected by the multilayer wiring layer MWL, and in the area A2, the semiconductor element SE2 and the semiconductor element SE4 are electrically connected by the multilayer wiring layer MWL.

The inductor IND1 and inductor IND2 are formed in the multilayer wiring layer MWL by using a part of a plurality of wirings. The inductor IND2 is formed in a wiring layer different from that of the inductor IND1, and is formed at a position overlapping with the inductor IND1 in a plan view. The inductor IND1 is electrically connected to the semiconductor element SE3 which forms a part of the transmission/reception circuit C3, and the inductor IND2 is electrically connected to the semiconductor element SE4, which forms a part of the transmission/reception circuit C4, via the bonding wire BW.

A signal (s) can be transmitted/received in a non-contact manner between the inductor IND1 and the inductor IND2 by inductive coupling. Therefore, the semiconductor elements SE1 to SE4 are electrically coupled via the inductor IND1 and the inductor IND2. Incidentally, a quadrangular shape, an octagonal shape, or a circular shape can be applied to each of the planar shapes of the inductor IND1 and the inductor IND2.

The plurality of wirings formed on the uppermost layer of the multilayer wiring layer MWL include pad electrodes PAD. Although the plurality of wirings in the uppermost layer are covered with a protective film, the protective film is provided with an opening and a part of a front surface of the pad electrode PAD is exposed from (in) the opening.

The pad electrodes PAD electrically connected to the semiconductor elements SE1 and SE3 are electrically connected to a lead frame LF1 (die pad DP1) by the bonding wire BW. The pad electrodes PAD electrically connected to the semiconductor elements SE2 and SE4 are electrically connected to a lead frame LF2 (die pad DP2) by the bonding wire BW. There is also a bonding wire BW for connecting the pad electrode PAD electrically connected to the inductor IND2 and the pad electrode PAD electrically connected to the semiconductor element SE4.

On a back surface BS side of the semiconductor substrate SUB, the die pad DP1 is mounted on the semiconductor substrate SUB in the area A1, and the die pad DP2 is mounted on the semiconductor substrate SUB in the area A2. Consequently, the semiconductor substrate SUB in the area A1 is conductive with the die pad DP1, and the semiconductor substrate SUB in the area A2 is conductive with the die pad DP2. Further, the die pad DP1 and the die pad DP2 are different conductive members from each other and are electrically insulated from each other.

The die pad DP1 and the die pad DP2 are a part of the lead frame LF1 and a part of the lead frame LF2, respectively. However, in the first embodiment, portions on which the semiconductor substrate SUB in the lead frame LF1 and the lead frame LF2 is mounted are called the die pad DP1 and the die pad DP2. The lead frame LF1 and the lead frame LF2 electrically connect the controller circuit C1, the gate driver circuit C2, the transmission/reception circuit C3, and the transmission/reception circuit C4 to an external circuit, wiring, or the like of the semiconductor device SD.

Incidentally, in the first embodiment, the back surface BS of the semiconductor substrate SUB in the area A1 and the area A2 directly contacts with each of the die pad DP1 and the die pad DP2. However, another conductive member may be interposed between the semiconductor substrate SUB in the areas A1 and A2 and the die pads DP1 and DP2. Conductivity has only to be ensured between the semiconductor substrate SUB in the areas A1 and A2 and the die pads DP1 and DP2.

The semiconductor substrate SUB, the die pad DP1, the die pad DP2, the bonding wire BW, and the multilayer wiring layer MWL including the inductor IND1 and the inductor IND2 are sealed with a mold resin MR. For a configuration of the mold resin MR, techniques and materials known as mold resins in semiconductor technology are adopted.

As shown in FIGS. 3 and 4, in the first embodiment, a through hole TH penetrating the semiconductor substrate SUB is formed in the area A3. The through hole TH has a side surface SS1 on an area A1 side and a side surface SS2 on an area A2 side. The side surface SS1 and the side surface SS2 are opposite to each other in the X direction. Further, as shown in FIG. 1, the through hole TH is located between the area A1 and the area A2 in the X direction and extends in the Y direction. The semiconductor substrate SUB in the area A1 and the semiconductor substrate SUB in the area A2 are separated by the through hole TH.

Further, in the through hole TH, an element isolation portion EIP1 protruding from a front surface TS side of the semiconductor substrate SUB toward a back surface BS side of the semiconductor substrate SUB is formed. The element isolation portion EIP1 is an inorganic insulating film, for example, a silicon oxide film. Further, the element isolation portion EIP1 is in contact with the interlayer insulating film IL0. Incidentally, in the first embodiment, a case where a plurality of element isolation portions EIP1 are formed in the through hole TH is exemplified.

In the first embodiment, an inside of the through hole TH is embedded by the mold resin MS. Consequently, the semiconductor substrate SUB in the area A1 and the semiconductor substrate SUB in the area A2 are electrically insulated by the mold resin MS and the plurality of element isolation portions EIP1.

The main features of the semiconductor device SD in the first embodiment relate to the through hole TH, the element isolation portion EIP1, and a structure around them. Such features will be described in detail below.

<Main Features of Semiconductor Device SD>

The semiconductor device SD according to the first embodiment includes an inductor IND1, an inductor IND2, a controller circuit C1, a gate driver circuit C2, a transmission/reception circuit C3, and a transmission/reception circuit C4. Consequently, as compared with a case of assembling two semiconductor chips each including the inductor IND1 and the inductor IND2 like Patent Document 1, the miniaturization of the semiconductor device SD can be promoted.

Here, the inventors of the present application have newly found the following problems about the miniaturization of the semiconductor device SD.

As a new first problem, improvement of a withstand voltage (dielectric strength voltage) can be mentioned. As described above, a drive voltage of the semiconductor element SE2 forming a part of the gate driver circuit C2 is about several hundred V, which is much higher than each drive voltage of the semiconductor elements SE1 and SE3. A withstand voltage between the area A1 and the area A2 needs to be sufficiently secured.

In the first embodiment, the area A3 located between the area A1 and the area A2 is provided, and the semiconductor substrate SUB in the area A1 and the semiconductor substrate SUB in the area A2 are separated by the through hole TH formed in the area A3. Then, the mold resin MS and the plurality of element isolation portions EIP1 are formed in the through hole TH. Therefore, since the withstand voltage between the area A1 and the area A2 is sufficiently secured, reliability of the semiconductor device SD can be improved.

In addition, in order to further increase the dielectric voltage, it is effective to increase (enlarge) a creepage distance between the area A1 and the area A2. If a distance between the area A1 and the area A2 (a diameter of the through hole TH) is simply increased, the above-mentioned creepage distance can be secured. However, in this case, it becomes difficult to promote the miniaturization of the semiconductor device SD. For this reason, the element isolation portion EIP1 is provided in the through hole TH.

For example, when the element isolation portion EIP1 is not provided, the above-mentioned creepage distance is calculated along an interface between the interlayer insulating film IL0 and the mold resin MR, and has a length L1 shown in FIG. 4. Here, the element isolation portion EIP1 is in contact with the interlayer insulating film IL0, and is composed of an inorganic insulating film like the interlayer insulating film IL0. Therefore, in the first embodiment, the above-mentioned creepage distance also includes a length L2 of the element isolation portion EIP1 in the Z direction.

As shown in FIG. 4, when the three element isolation portions EIP1 are provided, the above-mentioned creepage distance is "length L1+length L2×6". That is, since the element isolation portions EIP1 are provided in the through hole TH, the reliability of the semiconductor device SD can be further improved.

Incidentally, the length in the Z direction is, in other words, a length in a direction verging toward the back surface BS side of the semiconductor substrate SUB from the front surface TS side of the semiconductor substrate SUB.

In the first embodiment, the length L1 is, for example, 20 to 40 µm, and the length L2 is, for example, 5 to 15 µm. In addition, a length (width) of the element isolation portion EIP1 in the X direction is, for example, 2 to 6 µm.

Further, a length of the element isolation portion EIP2 in the Z direction is, for example, 1 to 3 µm. Therefore, in the Z direction, the length L2 of the element isolation portion EIP1 is longer than the length of the element isolation portion EIP2. In this way, in the first embodiment, the above-mentioned creepage distance is secured by providing the element isolation portion EIP1 which is longer than the element isolation portion EIP2.

A planar shape of the element isolation portion EIP1 will be described below. FIGS. 5 and 6 each show an example of a planar shape of the element isolation portion EIP1.

As shown in FIG. 5, the element isolation portion EIP1 extends in the Y direction, and a length of the element isolation portion EIP1 in the Y direction is longer than the length of the element isolation portion EIP1 in the X direction. Here, in a plan view, when a virtual straight line VSL is drawn from a side surface SS1 of the through hole TH on the area A1 side toward a side surface SS2 of the through hole TH on the area A2 side, the virtual straight line VSL passes through the element isolation portion EIP1. That is, the above-mentioned creepage distance always includes the length L2 of the element isolation portion EIP1. Therefore, even if at least one element isolation portion EIP1 is provided in the through hole TH, the above-mentioned creepage distance can be increased (enlarged).

Further, in FIG. 5, the plurality of element isolation portions EIP1 extend in the Y direction, and are each provided in a striped shape. As the number of element isolation portions EIP1 is larger, the above-mentioned creepage distance can be further made longer, which can further improve the reliability of the semiconductor device SD.

Also in FIG. 6, the plurality of element isolation portions EIP1 are provided, but the plurality of element isolation portions EIP1 are each provided in a staggered or dotted shape. That is, the plurality of element isolation portions EIP1 are provided in one row as an element isolation portion group in the Y direction, and a plurality of rows of element isolation portion groups are provided in the X direction. Incidentally, even in this case, regarding one element isolation portion EIP1, the length of the element isolation portion EIP1 in the Y direction is longer than the length of the element isolation portion EIP1 in the X direction.

Even in FIG. 6, when the virtual straight line VSL is drawn from the side surface SS1 toward the side surface SS2 in a plan view, the virtual straight line VSL passes through the element isolation portion EIP1. Therefore, the above-mentioned creepage distance can be increased in length.

Incidentally, each planar shape of the plurality of element isolation portions EIP1 is not limited to the above-mentioned stripe shape, staggered shape, or dotted shape, and can also be made another shape as long as the virtual straight line VSL is designed so as to pass through at least one element isolation portion EIP1.

Next, as a new second problem, improvement of heat dissipation can be mentioned.

For example, as shown in FIG. 3, if the semiconductor substrate SUB in the area A1 and the semiconductor substrate SUB in the area A2 are mounted on one die pad even when the through hole TH is provided in the area A3, these semiconductor substrates are conductive via the die pad. Consequently, deterioration of the withstand voltage may be caused. Therefore, in order to prevent such conduction, it is conceivable to provide an insulating adhesive layer or the like between the semiconductor substrate SUB and the die pad.

However, in that case, heat stays in the semiconductor substrate SUB, so that heat dissipation properties deteriorate. In the first embodiment, the two die pads DP1 and DP2 separated from each other are prepared, the semiconductor substrate SUB in the area A1 is conductive with the die pad DP1, and the semiconductor substrate SUB in the area A2 is conductive with the die pad DP2.

That is, the heat stayed in the semiconductor substrate SUB is released to the die pad DP1 or the die pad DP2 as shown in a discharge path R1 shown in FIG. 4. Therefore, since the heat dissipation proprieties are improved, the reliability of the semiconductor device SD can be improved.

Next, as a new third problem, noise suppression can be mentioned.

Similar to the above-mentioned second problem, when an insulating adhesive layer or the like is provided between the semiconductor substrate SUB and the die pad, a potential (node) of the semiconductor substrate SUB tends to float and it becomes difficult to resolve noise transmitted to the semiconductor substrate SUB.

However, in the first embodiment, the noise in the area A1 is discharged via the die pad DP1, and the noise in the area A2 is discharged via the die pad DP2. That is, the noise is discharged to the die pad DP1 or the die pad DP2 like a noise discharge path R2 shown in FIG. 4. Therefore, since the noise is suppressed, performance of the semiconductor device SD can be improved.

Next, the other features of the first embodiment will be described.

As described above, in the first embodiment, the mold resin MS is embedded in the through hole TH. Here, if an aspect ratio of the through hole TH is appropriate, embedding properties of the mold resin MS can be improved. If the embedding properties of the mold resin MS are low, a void(s) or the like is generated in the through hole TH, which may cause a problem in which unintended moisture is contained in the void.

Therefore, in the first embodiment, a sectional shape of the through hole TH is trapezoidal. Specifically, a distance between the side surface SS1 of the through hole TH on the area A1 side and the side surface SS2 of the through hole TH on the area S2 side becomes wider from the front surface TS side of the semiconductor substrate SUB toward the back surface BS side of the semiconductor substrate SUB. In other words, the diameter of the through hole TH becomes wider from the front surface TS side of the semiconductor substrate SUB toward the back surface BS side of the semiconductor substrate SUB. Therefore, since the embedding properties of the mold resin MS are improved, the reliability of the semiconductor device SD can be improved.

<Manufacturing Method of Semiconductor Device SD>

A manufacturing method of the semiconductor device SD according to the first embodiment will be described below with reference to FIGS. 7 to 12.

Figure 7:
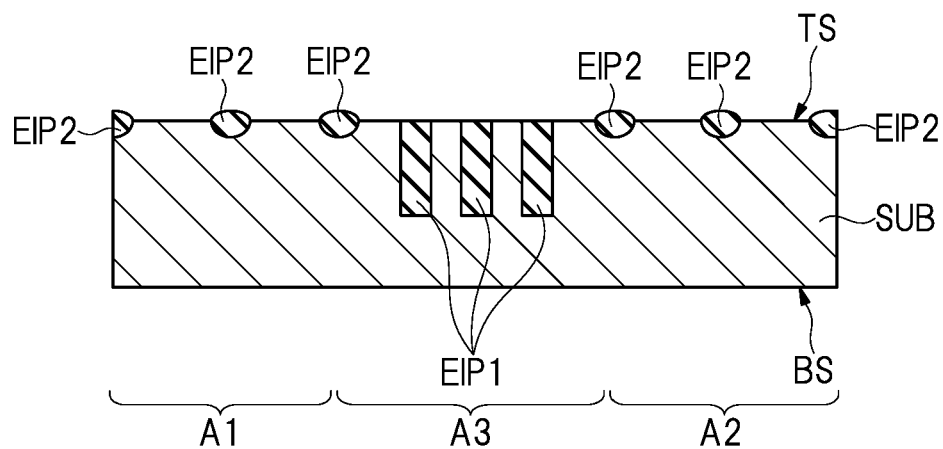
FIG. 7 is a sectional view showing a manufacturing method of the semiconductor device according to the first embodiment.

FIG. 7 shows a process of forming the element isolation portion EIP2 and the element isolation portion EIL1.

First, the semiconductor substrate SUB is prepared. The semiconductor substrate SUB is preferably made of single crystal silicon having a specific resistance of about 1 to 10 Ωcm, and is made of, for example, p-type single crystal silicon.

Next, a silicon nitride film having a plurality of openings is formed on the front surface TS of the semiconductor substrate SUB, and then a thermal oxidation treatment is performed so that a region which is not covered with the above silicon nitride film in the semiconductor substrate SUB is selectively thermally oxidized. Thereafter, the above silicon nitride film is removed. In this way, the plurality of element isolation portions EIP2 are selectively formed in the semiconductor substrate SUB.

Incidentally, although the element isolation portion EIP2 is mainly formed in the area A1 and the area A2, the element isolation portion EIP2 may be formed in the area A3.

Next, a mask pattern made of a photoresist film, a silicon nitride film, or the like and having a plurality of openings is formed on the front surface TS of the semiconductor substrate SUB. Next, by performing a dry etching processing, a plurality of trenches are selectively formed in a region that is not covered with the mask pattern in the semiconductor substrate SUB.

Next, an insulating film made of, for example, a silicon oxide film is deposited on the front surface TS of the semiconductor substrate SUB including insides of the above plurality of trenches by, for example, a CVD method. Next, the insulating film outside the above plurality of trenches is removed by polishing the above insulating film by the CMP method. In this way, the element isolation portion EIL1 is formed by embedding the above insulating film in each of the above plurality of trenches. In the first embodiment, the element isolation portion EIL1 is formed in the area A3.

Incidentally, either a step of forming the element isolation portion EIP2 or a step of forming the element isolation portion EIL1 may be performed first.

Figure 8:
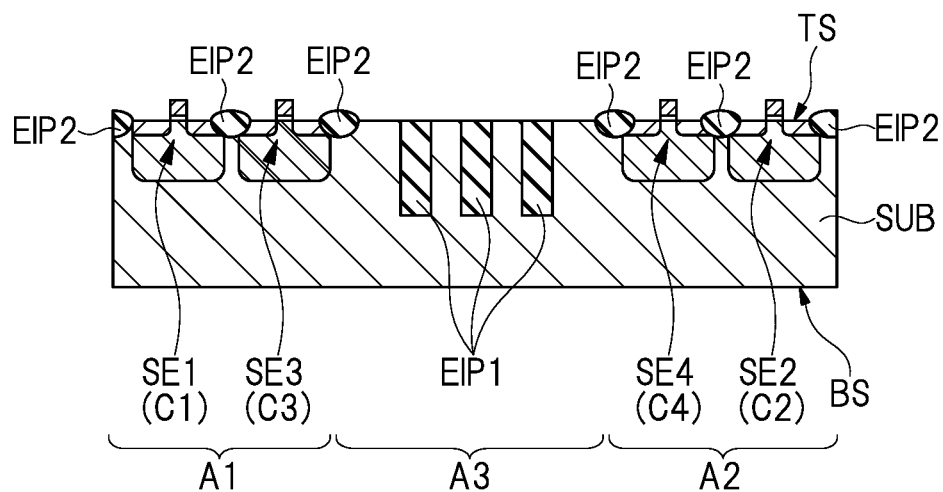
FIG. 8 is a sectional view showing the manufacturing method of the semiconductor device following FIG. 7.

FIG. 8 shows a process of forming the semiconductor elements SE1 to SE4.

First, a p-type or n-type well region is formed in the semiconductor substrate SUB in the area A1 and the area A2 by photolithography technology and ion implantation. Next, a gate insulating film and a gate electrode are formed on the front surface TS of the semiconductor substrate SUB in the area A1 and the area A2, and then impurity regions to be a source region and a drain region are formed in the semiconductor substrate SUB by the photolithography technology and the ion implantation. In this way, the semiconductor elements SE1 and SE3 are formed on the front surface TS side of the semiconductor substrate SUB in the area A1, and the semiconductor elements SE2 and SE4 are formed on the front surface TS side of the semiconductor substrate SUB in the area A2.

Figure 9:
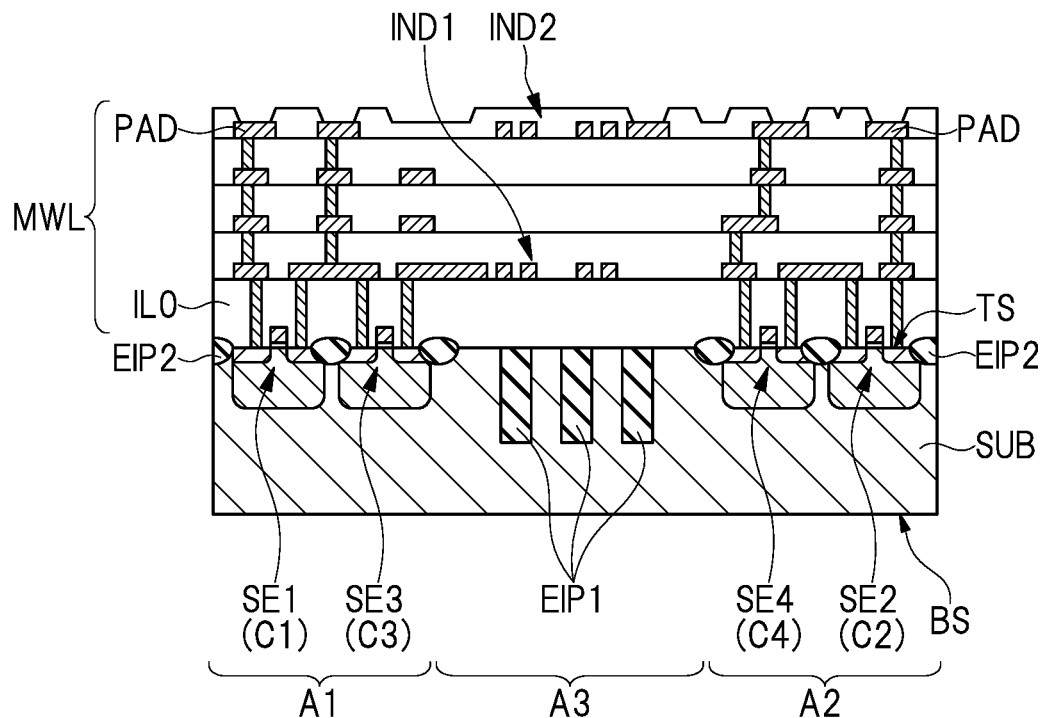
FIG. 9 is a sectional view showing the manufacturing method of the semiconductor device following FIG. 8.

FIG. 9 shows a process of forming the multilayer wiring layer MWL.

First, the interlayer insulating film IL0 is formed on the front surface TS of the semiconductor substrate SUB in the areas A1 to A3 by, for example, the CVD method. Next, a via(s) is formed in the interlayer insulating film IL0 by the photolithography technique and the etching processing. Next, by embedding an inside of the above via with a conductive film such as a tungsten film, a plug(s) is formed in the interlayer insulating film IL0.

Next, a conductive film mainly composed of an aluminum film is formed on the interlayer insulating film IL0. Next, a wiring (s) connected to the above plug is formed by patterning the above conductive film through the photolithography technique and the etching processing. By repeating such a process to form an interlayer insulating film, a plug, and a wiring over a plurality of layers, the multilayer wiring layer MWL is formed.

Incidentally, the inductor IND1 and the inductor IND2 are formed in the multilayer wiring layer MWL, and are mutually formed in different wiring layers. Further, a plurality of wirings formed on the uppermost layer of the multilayer wiring layer MWL include a pad electrode(s) PAD. Although the plurality of wirings in the uppermost layer are covered with a protective film, the protective film is provided with an opening, and a part of a front surface of the pad electrode PAD is exposed in (from) the opening.

Figure 10:
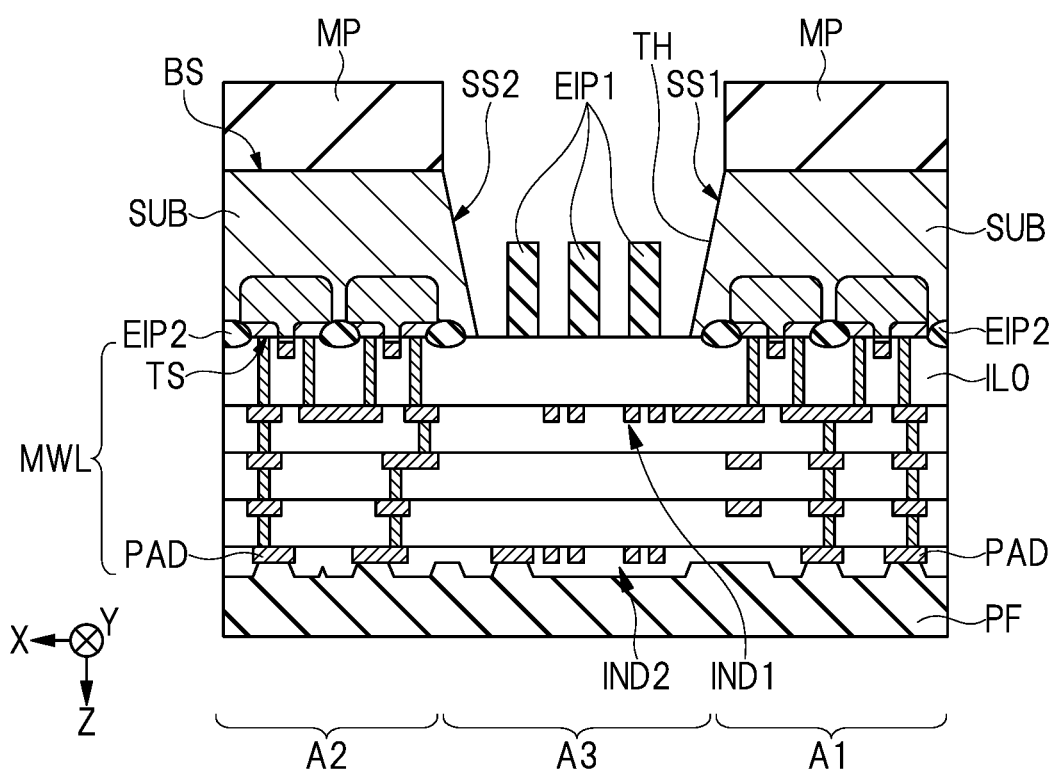
FIG. 10 is a sectional view showing the manufacturing method of the semiconductor device following FIG. 9.

FIG. 10 shows a process of forming the through hole TH.

First, a protective film PF made of, for example, a silicon oxide film is formed on the multilayer wiring layer MWL by, for example, a CVD method. Next, a mask pattern MP having an opening and made of a photoresist film is formed on the back surface BS of the semiconductor substrate SUB by regarding the back surface BS of the semiconductor substrate SUB as an upper surface. Next, by performing an anisotropic etching processing, the semiconductor substrate SUB exposed from the above opening is etched to form the through hole TH penetrating the semiconductor substrate SUB. Here, the anisotropic etching processing is performed under the condition that a selection ratio with respect to the interlayer insulating film IL0 made of an inorganic insulating film and to the element isolation portion EIP1 is high.

In addition, the back surface BS of the semiconductor substrate SUB may be polished to a desired thickness by the CMP method before the through hole TH is formed.

Further, as the anisotropic etching processing, a wet etching processing or a dry etching processing can be applied. Applied as an etching agent used in the wet etching processing can be potassium hydroxide (KOH) aqueous solution, tetramethylammonium hydroxide (TMAH) aqueous solution, ethylenediamine/pyrocatel (EDP) aqueous solution, hydrazine ($N_2H_4$) aqueous solution, sodium hydroxide (NaOH) aqueous solution, and cesium hydroxide (CsCH) aqueous solution.

When the through hole TH is formed by such an etching agent, an etching rate differs depending on a crystal orientation of the semiconductor substrate SUB. Specifically, the semiconductor substrate SUB is etched so that a distance between the side surface SS1 of the through hole TH on the area A1 side and the side surface SS2 of the through hole TH on the area S2 side becomes narrow (short) toward the front surface TS side of the semiconductor substrate SUB from the back surface BS side of the semiconductor substrate SUB. As a result, the sectional shape of the through hole TH becomes trapezoidal. Incidentally, an angle formed by the front surface TS of the semiconductor substrate SUB and the side surface SS1 or side surface SS2 of the through hole TH is, for example, 54.7 degrees.

After the formation of the through hole TH, the above mask pattern MP is removed, and then the protective film PF is also removed.

Figure 11:
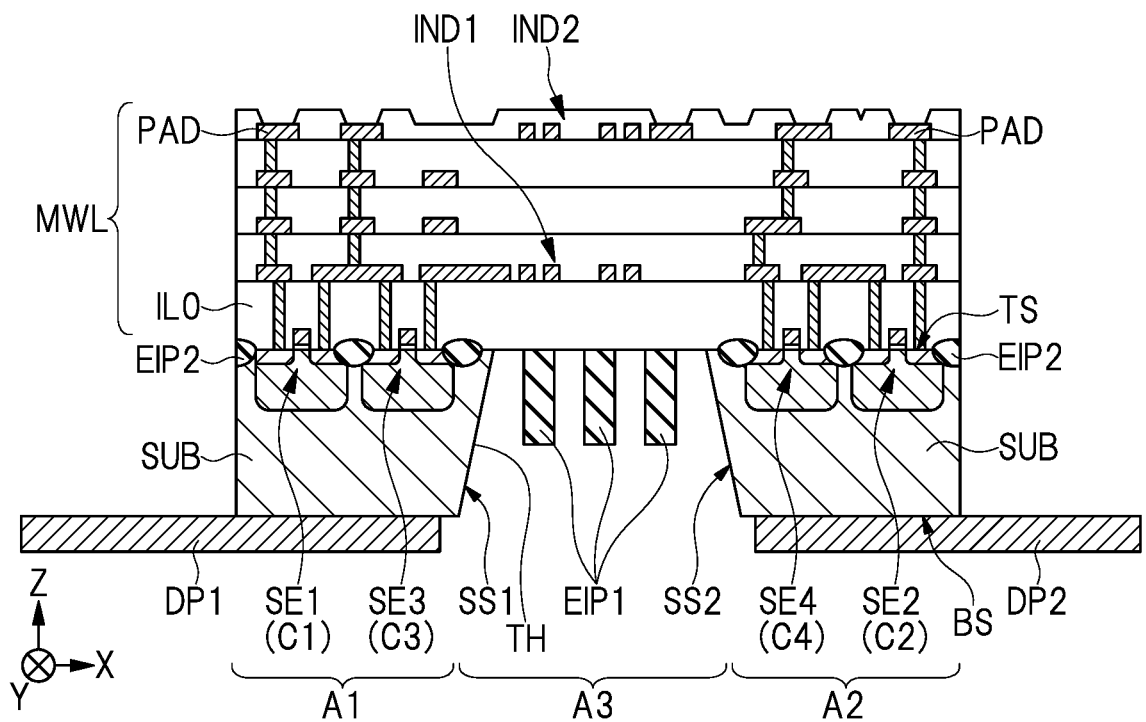
FIG. 11 is a sectional view showing the manufacturing method of the semiconductor device following FIG. 10.

FIG. 11 shows a process of mounting the semiconductor substrate SUB on the die pad DP1 and the die pad DP2.

First, the die pad DP1 and the die pad DP2 made of conductive members are prepared. The die pad DP1 and the die pad DP2 are separated from each other. Next, the semiconductor substrate SUB in the area A1 is mounted on the die pad DP1, and the semiconductor substrate SUB in the area A2 is mounted on the die pad DP2. Consequently, the semiconductor substrate SUB in the area A1 conducts with the die pad DP1, and the semiconductor substrate SUB in the area A2 conducts with the die pad DP2.

Incidentally, although the back surfaces BS of the semiconductor substrate SUB in the area A1 and the area A2 directly contact with the die pad DP1 and the die pad DP2, other conductive member may be provided between the semiconductor substrate SUB in the areas A1, A2 and the die pads DP1, DP2.

Figure 12:
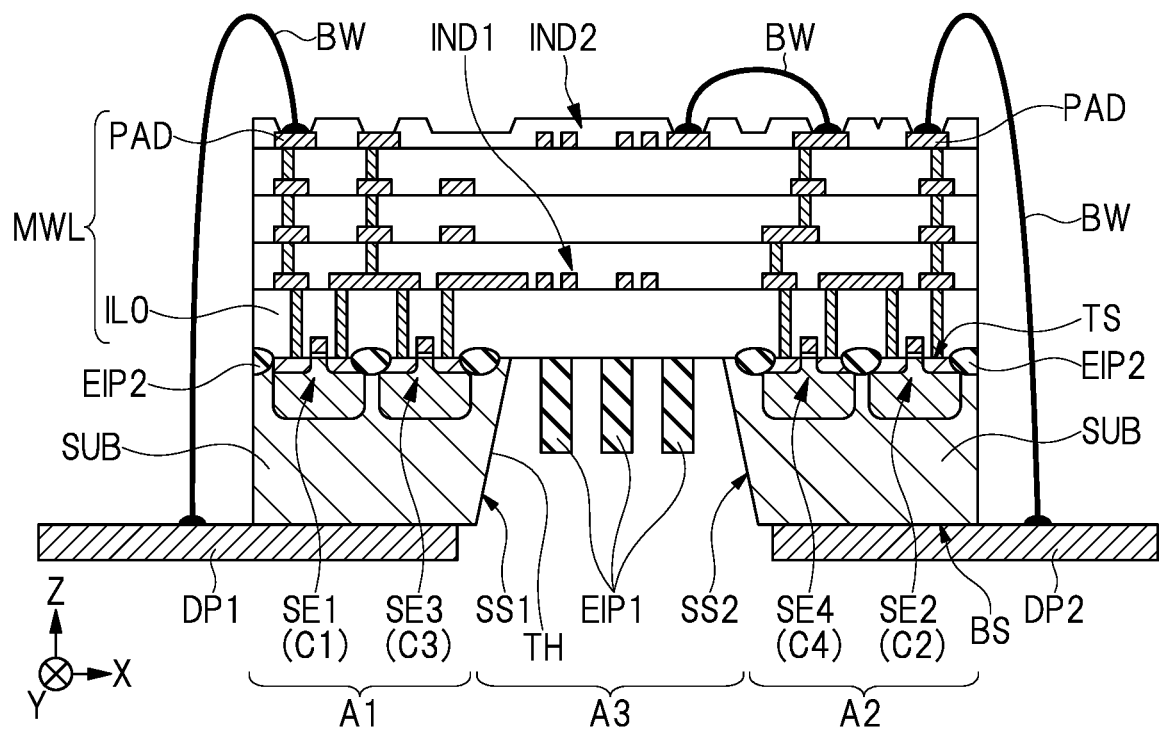
FIG. 12 is a sectional view showing the manufacturing method of the semiconductor device following FIG. 11.

FIG. 12 shows a connecting process by the bonding wires BW.

The pad electrode PAD electrically connected to the semiconductor elements SE1 and SE3 is electrically connected to the die pad DP1 by the bonding wire BW. Further, the pad electrode PAD electrically connected to the semiconductor elements SE2 and SE4 is electrically connected to the die pad DP2 by another bonding wire BW. Further, the pad electrode PAD electrically connected to the inductor IND2 is connected by another bonding wire BW to the pad electrode PAD electrically connected to the semiconductor elements SE2 and SE4.

After FIG. 12, the lead frame LF1 and the lead frame LF2 are formed by processing the conductive members constituting the die pad DP1 and the die pad DP2. Next, sealed by the mold resin MR are the semiconductor substrate SUB including the through hole TH; the multilayer wiring layer MWL including the inductor IND1 and the inductor IND2; the die pad DP1; the die pad DP2; and the bonding wire BW. A known injection molding technique or the like can be used for forming the mold resin MS.

As described above, the semiconductor device SD shown in FIG. 3 is manufactured.

First Modification Example

Figure 13:
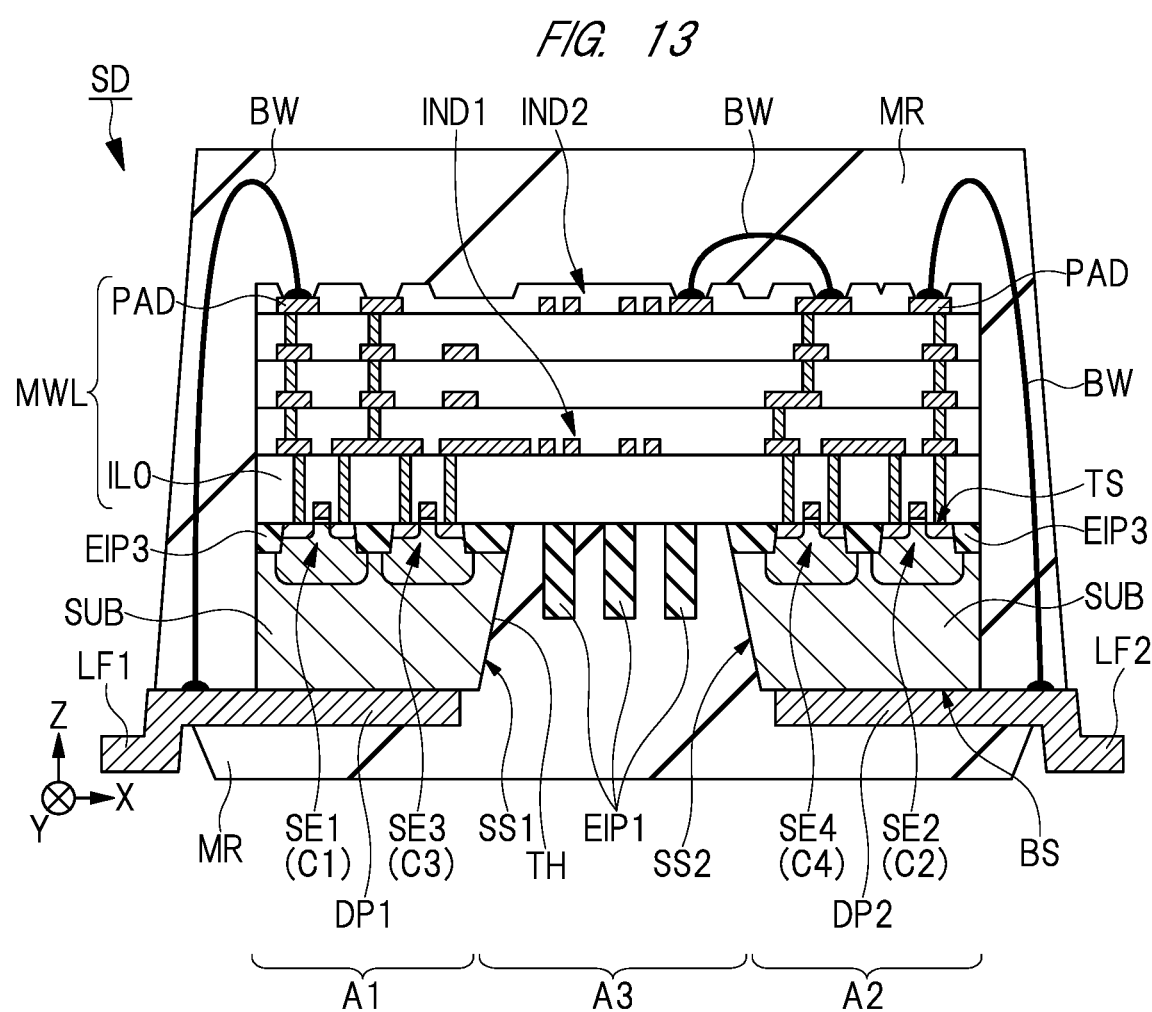
FIG. 13 is a sectional view showing a semiconductor device in a first modification example.

FIG. 13 is a sectional view showing a semiconductor device SD in a first modification example of the first embodiment.

In the first embodiment, the element isolation portion EIP2 having a LOCOS structure has been formed in the semiconductor substrate SUB. As shown in FIG. 13, in a first modification example, element isolation portion EIP3 having an STI (Shallow Trench Isolation) structure is formed in the semiconductor substrate SUB instead of the element isolation portion EIP2.

Each element isolation portion EIP3 is formed as follows. First, a photoresist film having a plurality of openings is formed on the front surface TS of the semiconductor substrate SUB. Next, by performing the dry etching processing, a plurality of trenches are selectively formed in a region that is not covered with the photoresist film in the semiconductor substrate SUB.

Next, an insulating film made of, for example, a silicon oxide film is deposited on the front surface TS of the semiconductor substrate SUB including insides of the above plurality of trenches by, for example, a CVD method. Next, the above insulating film outside the above plurality of trenches is removed by polishing the above insulating film through the CMP method. In this way, the element isolation portion EIL3 is formed by embedding the above insulating film in each of the above plurality of trenches.

Even in the first modification example, the element isolation portion EIP3 projects from the front surface TS side of the semiconductor substrate SUB toward the back surface BS side of the semiconductor substrate SUB. Further, in the Z direction, the length L2 of the element isolation portion EIP1 is longer (larger) than a length of the element isolation portion EIP3. Therefore, since the element isolation portion EIP1 which is longer than the element isolation portion EIP3 is provided, the creepage distance can be secured.

Second Embodiment

Figure 14:
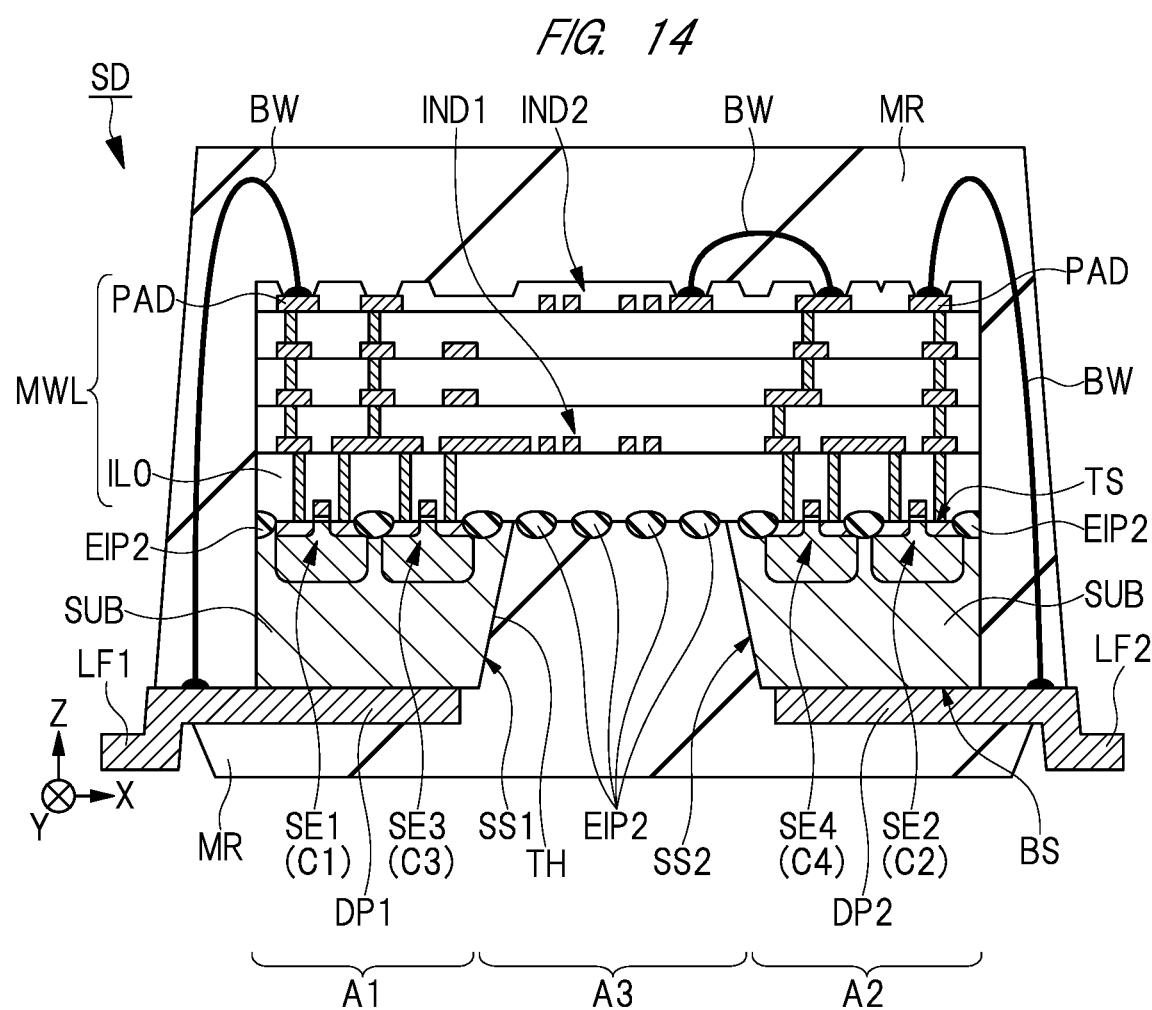
FIG. 14 is a sectional view showing a semiconductor device according to a second embodiment.

A semiconductor device SD according to a second embodiment will be described below with reference to FIG. 14. Incidentally, in the following, a difference between the first embodiment and a second embodiment will be mainly described.

In the first embodiment, the element isolation portion EIP1 having a structure different from that of the element isolation portion EIP2 has been formed in the area A3. As shown in FIG. 14, in a second embodiment, the element isolation portion EIP1 is not formed, and the element isolation portion EIP2 is formed in the areas A1 to A3 by the same process.

In the second embodiment, since the element isolation portion EIP2 projecting from the front surface TS side of the semiconductor substrate SUB toward the back surface BS side of the semiconductor substrate SUB is provided in the area A3, a creepage distance between the area A1 and the area A2 can be increased (enlarged).

Further, as described above, the length of the element isolation portion EIP2 is shorter in the Z direction than the length L2 of the element isolation portion EIP1. Therefore, from the viewpoint of increasing the creepage distance, the first embodiment is more effective than the second embodiment.

However, in the second embodiment, a step of forming the element isolation portion EIP1 can be omitted, so that manufacturing cost of the semiconductor device SD can be reduced.

Incidentally, the planar shape of the element isolation portion EIP2 in the area A3 may be a stripe shape as shown in FIG. 5, or a staggered shape or dotted shape as shown in FIG. 6. That is, in a plan view, when the virtual straight line VSL is drawn from the side surface SS1 toward the side surface SS2, the virtual straight line VSL passes through the element isolation portion EIP2 in the area A3.

Further, instead of the element isolation portion EIP2 in the areas A1 to A3, the element isolation portion EIP3 having the STI structure disclosed in the first modification example can be applied.

Third Embodiment

Figure 15:
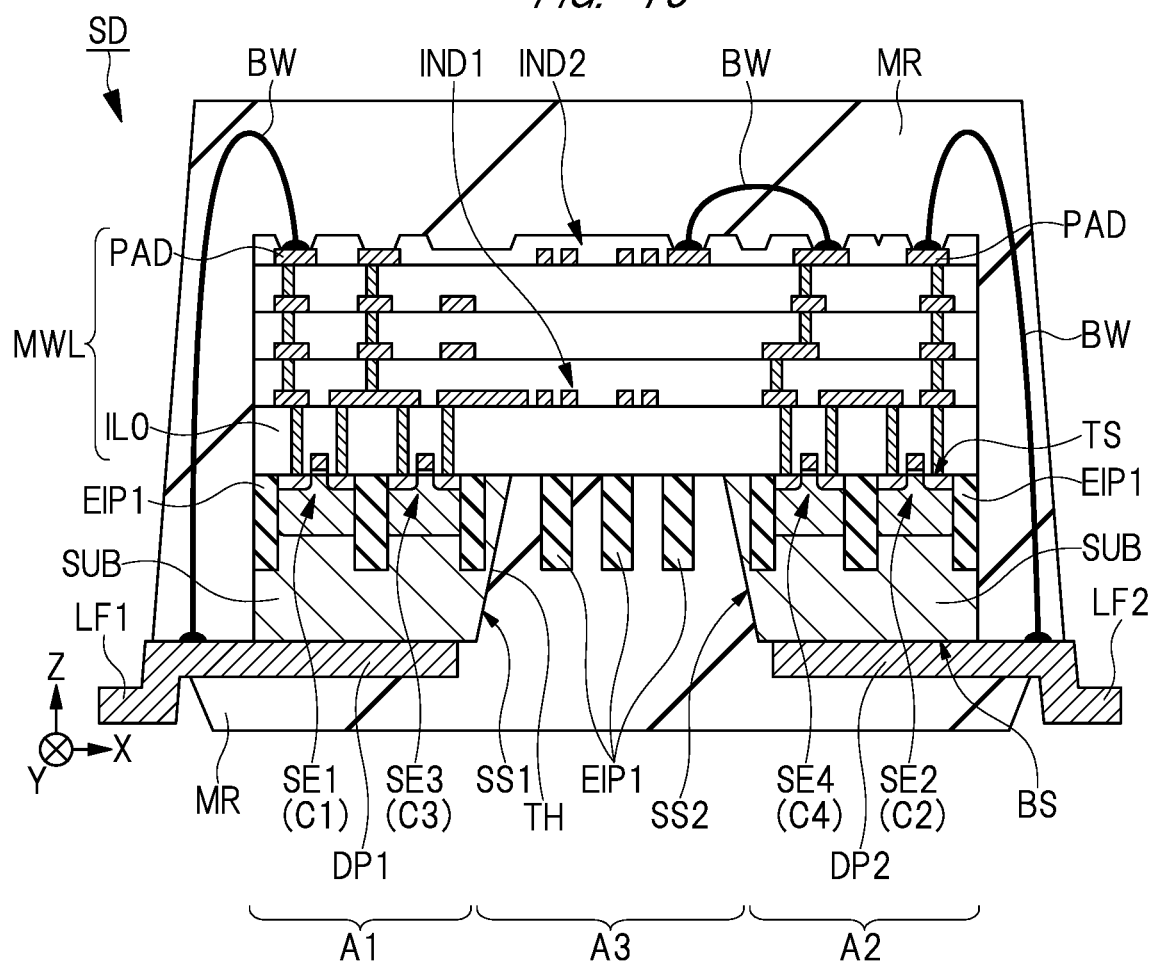
FIG. 15 is a sectional view showing a semiconductor device according to a third embodiment.

A semiconductor device SD according to a third embodiment will be described below with reference to FIG. 15. Incidentally, in the following, a difference between the first embodiment and a third embodiment will be mainly described.

In the first embodiment, the element isolation portion EIP2 having a structure different from that of the element isolation portion EIP1 has been formed in the area A1 and the area A2. As shown in FIG. 15, in the third embodiment, the element isolation portion EIP2 is not formed, and the element isolation portion EIP1 is formed in the areas A1 to A3 by the same process.

In the third embodiment, a step of forming the element isolation portion EIP2 can be omitted, so that manufacturing cost of the semiconductor device SD can be reduced.

Fourth Embodiment

Figure 16:
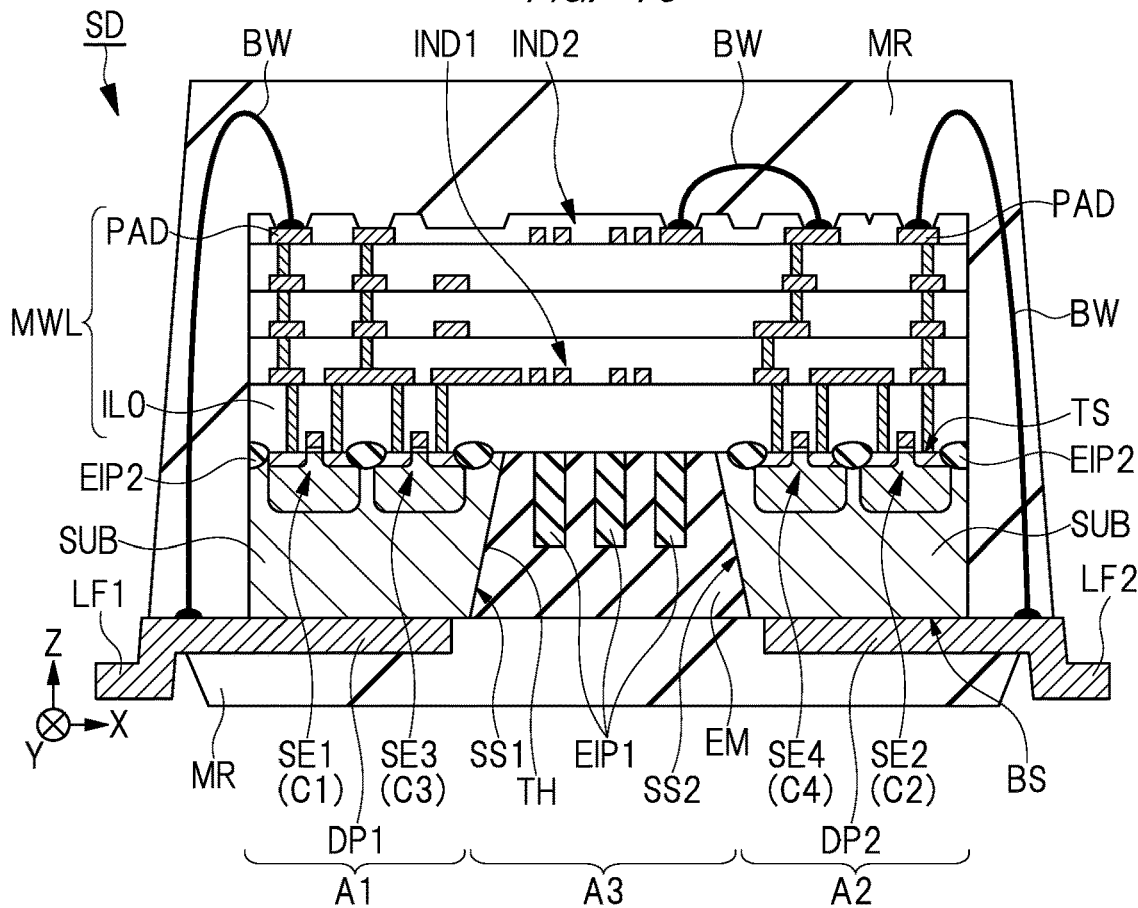
FIG. 16 is a sectional view showing a semiconductor device according to a fourth embodiment.

A semiconductor device SD according to a fourth embodiment will be described below with reference to FIG. 16. Incidentally, in the following, a difference between the first embodiment and a fourth embodiment will be mainly described.

In the first embodiment, the mold resin MS has been embedded in the through hole TH. As shown in FIG. 16, in the fourth embodiment, an embedded member EM is embedded in the through hole TH, and the embedded member EM is sealed by the mold resin MS together with the die pad DP1 and the die pad DP2, etc. Incidentally, the embedded member EM is a resin film such as a polyimide film.

The mold resin MS is formed by injection molding technology or the like. However, while an inside of the through hole TH is filled with the mold resin MS, stress may be generated from the mold resin MS to the side surface SS1 and the side surface SS2 of the through hole TH. By embedding the inside of the through hole TH in advance with the embedded member EM, such a defect can be suppressed. That is, since a strength of the semiconductor device SD is increased by the embedded member EM, the reliability of the semiconductor device SD can be improved.

Figure 18:
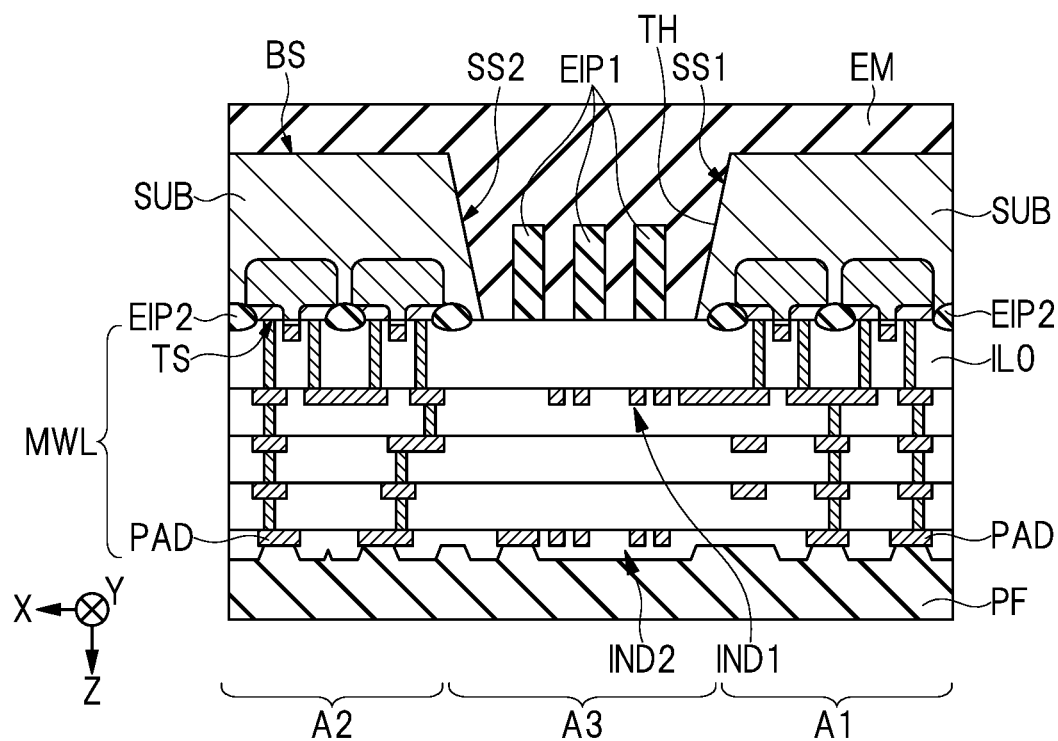
FIG. 18 is a sectional view showing the manufacturing method of the semiconductor device following FIG. 17.
Figure 19:
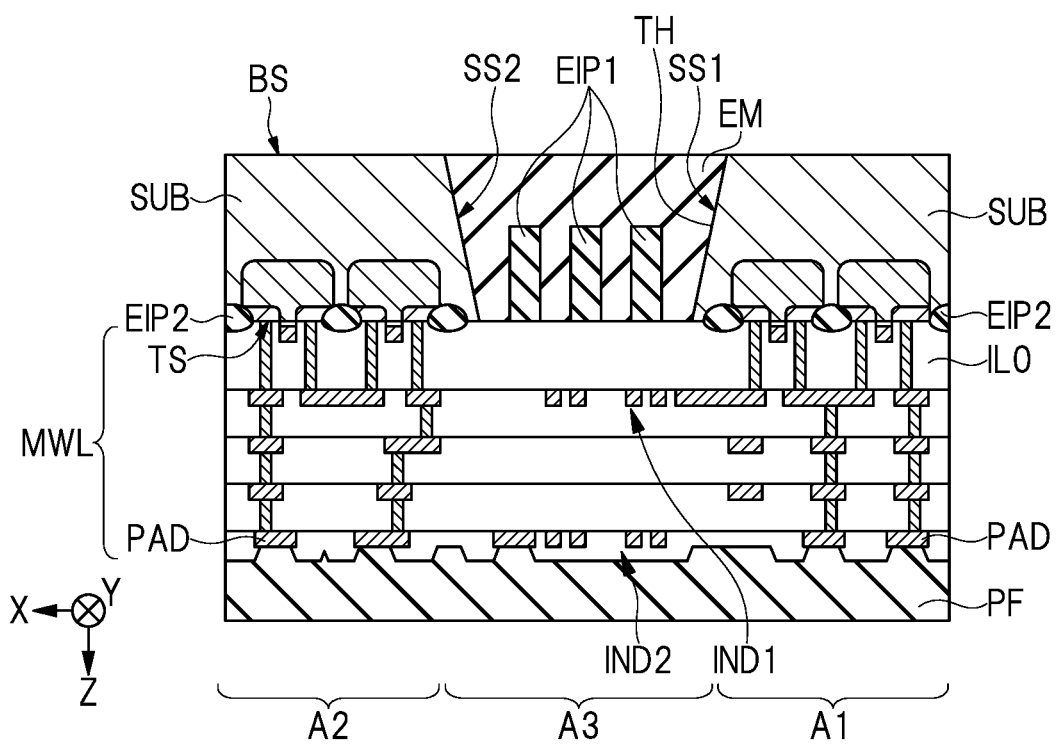
FIG. 19 is a sectional view showing the manufacturing method of the semiconductor device following FIG. 18.

A method of manufacturing the semiconductor device SD according to the fourth embodiment will be described below with reference to FIGS. 17 to 19. Each step performed in FIGS. 17 to 19 is performed between the steps performed in FIGS. 10 and 11.

Figure 17:
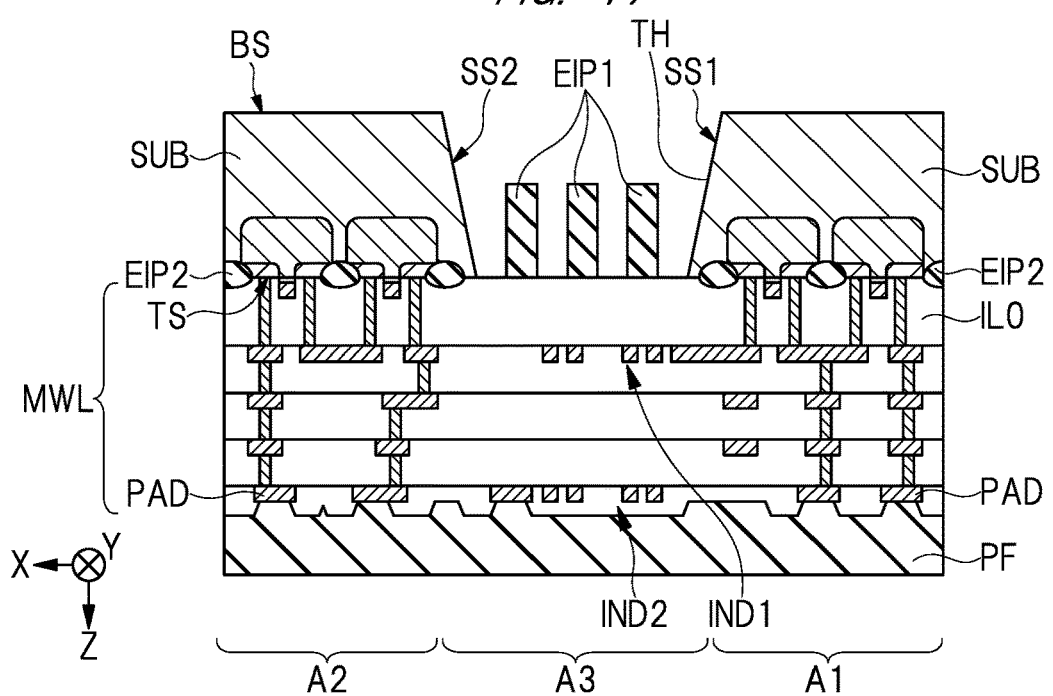
FIG. 17 is a sectional view showing a manufacturing method of the semiconductor device according to the fourth embodiment.

FIG. 17 shows a state in which the through hole TH is formed in FIG. 10 and the mask pattern MP is removed. Next, as shown in FIG. 18, the embedded member EM is formed on the back surface BS of the semiconductor substrate SUB by, for example, a coating method so as to embed the through hole TH. Then, as shown in FIG. 19, by performing a dry etching processing onto the embedded member EM, the embedded member EM on the back surface BS of the semiconductor substrate SUB is removed, and the embedded member EM is left (remains) in the through hole TH.

Further, while the embedded member EM is formed, embedding properties of the embedded member EM can be improved since the sectional shape of the through hole TH is trapezoidal.

Incidentally, the technique disclosed in the fourth embodiment can also be applied to the second embodiment and the third embodiment.

Second Modification Example

Figure 20:
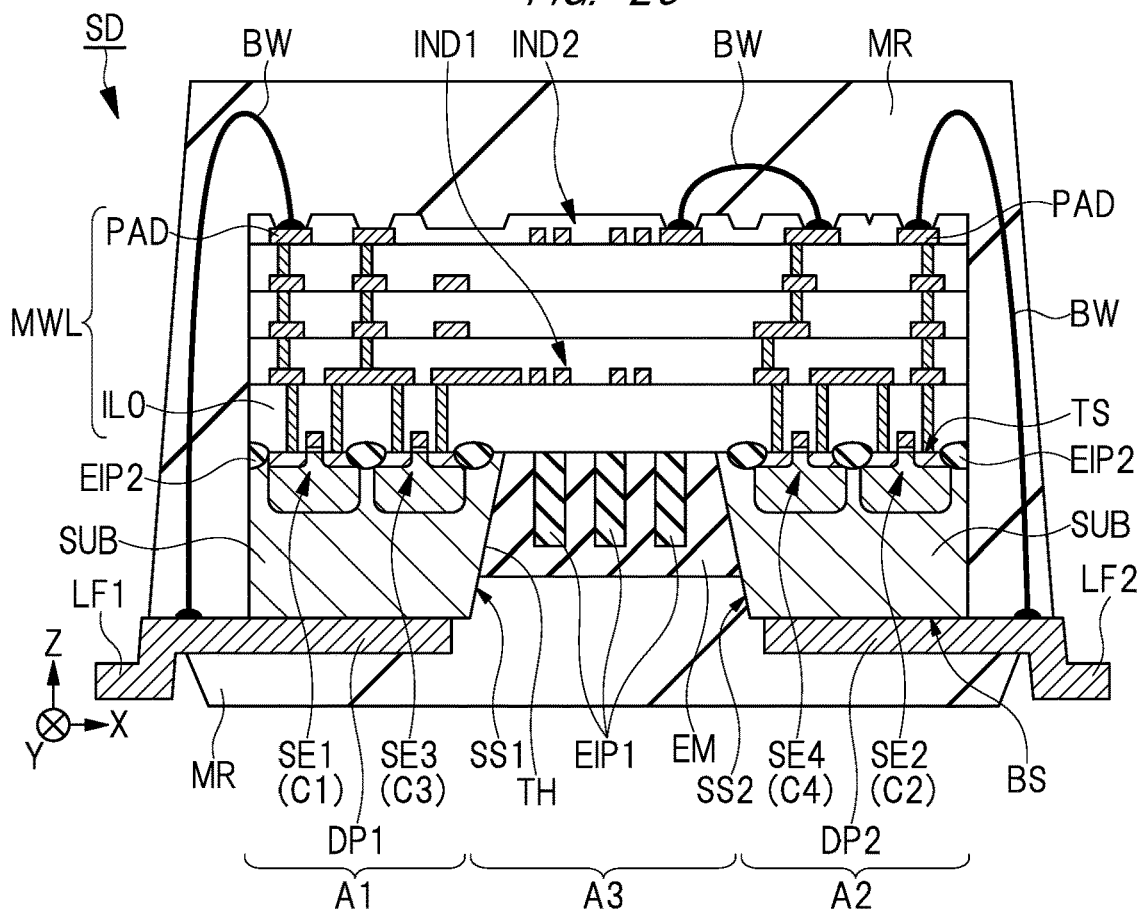
FIG. 20 is a sectional view showing a semiconductor device in a second modification example.
Figure 21:
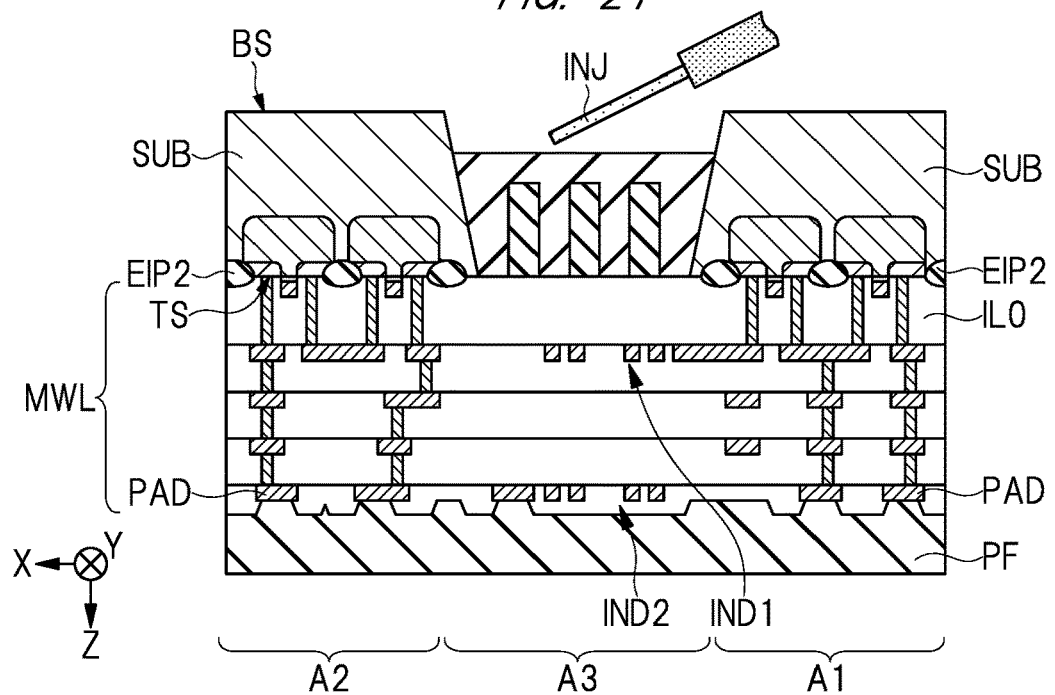
FIG. 21 is a sectional view showing a manufacturing method of the semiconductor device in the second modification example.

FIG. 20 is a sectional view showing a semiconductor device SD in a second modification example of the fourth embodiment, and FIG. 21 is a sectional view showing a manufacturing method of the semiconductor device SD in a second modification example.

As shown in FIG. 20, the embedded member EM may be embedded not in the entire inside of the through hole TH but in a part of the inside of the through hole TH. Even in this case, the strength of the semiconductor device SD can be increased.

For example, the embedded member EM is embedded inside the through hole TH so that the element isolation portion EIP1 is not exposed from the embedded member EM and the element isolation portion EIP1 is covered with the embedded member EM. This makes it possible to suppress the possibility that the element isolation portion EIP1 will collapse when the mold resin MS is formed.

Further, as shown in FIG. 21, the embedded member EM can also be embedded in the through hole TH by a mosquito method using an injector INJ. In this case, an embedding amount of embedded member EM can be adjusted with relatively high accuracy. Further, since the etching processing as shown in FIG. 19 does not need to be performed, the manufacturing cost of the semiconductor device SD can be reduced.

As described above, although the present invention has been specifically described above based on the embodiments thereof, the present invention is not limited to the above embodiment and can variously modified without departing from the scope thereof.

What is claimed is:

1. A semiconductor device having a first area in which a first semiconductor element is formed, a second area in which a second semiconductor element is formed, and a third area located between the first and second areas, the semiconductor device comprising:
   a semiconductor substrate having a front surface and a back surface opposite to the front surface;
   the first semiconductor element formed on a front surface side of the semiconductor substrate in the first area;
   the second semiconductor element formed on the front surface side of the semiconductor substrate in the second area and driven at a voltage higher than that of the first semiconductor element;
   a multilayer wiring layer formed on the first and second semiconductor elements;
   a first inductor formed in the multilayer wiring layer and electrically connected to the first semiconductor element; and
   a second inductor formed in a wiring layer different from that of the first inductor in the multilayer wiring layer and electrically connected to the second semiconductor element,
   wherein a through hole penetrating the semiconductor substrate is formed in the third area,
   wherein a first element isolation portion is formed in the through hole so as to project from the front surface side of the semiconductor substrate toward a back surface side of the semiconductor substrate,
   wherein, on the back surface side of the semiconductor substrate, the semiconductor substrate in the first area is mounted on a first die pad, and the semiconductor substrate in the second area is mounted on a second die pad,
   wherein the semiconductor substrate in the first area conducts with the first die pad,
   wherein the semiconductor substrate in the second area conducts with the second die pad, and
   wherein the semiconductor substrate including the through hole, the multilayer wiring layer including the first and second inductors, the first die pad, and the second die pad are sealed with a mold resin.

2. The semiconductor device according to claim 1,
   wherein the back surface of the semiconductor substrate in the first area directly contacts with the first die pad, and
   wherein the back surface of the semiconductor substrate in the second area directly contacts with the second die pad.

3. The semiconductor device according to claim 1, further comprising a plurality of second element isolation portions formed in the semiconductor substrate in the first and second areas,
   wherein a length of the first element isolation portion is longer than a length of each of the plurality of second element isolation portions in a direction verging toward the back surface side of the semiconductor substrate from the front surface side of the semiconductor substrate.

4. The semiconductor device according to claim 1, further comprising a plurality of first element isolation portions composed of the first element isolation portion,
   wherein the plurality of first element isolation portions are formed not only inside the through hole in the third area but also inside the semiconductor substrate in the first and second areas.

5. The semiconductor device according to claim 1,
   wherein, in a first direction in a plan view, the through hole is located between the first and second areas,
   wherein the through hole extends in a second direction intersecting the first direction in a plan view, and
   wherein a length of the first element isolation portion in the second direction is longer than a length of the first element isolation portion in the first direction.

6. The semiconductor device according to claim 5, wherein, in a plan view, when a virtual straight line is drawn from a first side surface of the through hole on a first area side toward a second side surface of the through hole on a second area side, the virtual straight line passes through the first element isolation portion.

7. The semiconductor device according to claim 5,
   wherein a plurality of first element isolation portions composed of the first element isolation portion are formed in the through hole, and
   wherein the plurality of first element isolation portions are each provided in a striped shape.

8. The semiconductor device according to claim 5,
   wherein a plurality of first element isolation portions composed of the first element isolation portion are formed in the through hole, and
   wherein the plurality of first element isolation portions are each provided in a staggered or dotted shape in a plan view.

9. The semiconductor device according to claim 1,
wherein an embedded member is embedded in the through hole, and
wherein the embedded member is also sealed with the mold resin.

10. The semiconductor device according to claim 1, wherein a distance between a first side surface of the through hole on a first area side and a second side surface of the through hole on the second area side becomes wide in a direction verging toward a back surface side of the semiconductor substrate from a front surface side of the semiconductor substrate.

11. A method of manufacturing a semiconductor device, the semiconductor device having a first area in which a first semiconductor element is formed, a second area in which a second semiconductor element is formed, and a third area located between the first and second areas, the method comprising:
 (a) preparing a semiconductor substrate having a front surface and a back surface opposite to the front surface;
 (b) forming, in the semiconductor substrate, a first element isolation portion projecting from a front surface side of the semiconductor substrate toward a back surface side of the semiconductor substrate;
 (c) forming the first semiconductor element on the front surface side of the semiconductor substrate in the first area;
 (d) forming the second semiconductor element on the front surface side of the semiconductor substrate in the second area, the second semiconductor element being driven by a voltage higher than that of the first semiconductor element;
 (e) forming a multilayer wiring layer on the first and second semiconductor elements, the multilayer wiring layer including a first inductor electrically connected to the first semiconductor element, and a second inductor formed on a wiring layer different from that of the first inductor and electrically connected to the second semiconductor element;
 (f) forming a through hole penetrating the semiconductor substrate so that the first element isolation portion is exposed in the third area;
 (g) on the back surface side of the semiconductor substrate, mounting the semiconductor substrate in the first area on a first die pad so that the semiconductor substrate in the first area conducts with the first die pad, and mounting the semiconductor substrate in the second area on a second die pad so that the semiconductor substrate in the second area conducts with the second die pad; and
 (h) sealing, with a mold resin, the first and second die pads, the semiconductor substrate including the through hole, and the multilayer wiring layer including the first and second inductors.

12. The method according to claim 11, wherein, in the (g), the back surface of the semiconductor substrate in the first area directly contacts with the first die pad, and the back surface of the semiconductor substrate in the second area directly contacts with the second die pad.

13. The method according to claim 11, wherein, in the (b), a plurality of first element isolation portions composed of the first element isolation portion are formed in the semiconductor substrates in each of the first, second, and third areas.

14. The method according to claim 13, wherein the plurality of first element isolation portions are formed by a step of selectively thermally oxidizing the semiconductor substrate or a step of forming a plurality of trenches in the semiconductor substrate to embed an insulating film in each of the plurality of trenches.

15. The method according to claim 12, further comprising:
 (i) forming, in the semiconductor substrate in the first and second areas, a plurality of second element isolation portions projecting from the front surface side of the semiconductor substrate toward the back surface side of the semiconductor substrate,
 wherein, in the (b), the first element isolation portion is formed in the semiconductor substrate in the third area, and
 wherein in a direction verging toward the back surface side of the semiconductor substrate from the front surface side of the semiconductor substrate, a length of the first element isolation portion is longer than a length of each of the plurality of second element isolation portions.

16. The method according to claim 15,
wherein the plurality of second element isolation portions are formed by a step of selectively thermally oxidizing the semiconductor substrate or a step of forming a plurality of second trenches in the semiconductor substrate to embed a second insulating film in each of the plurality of trenches, and
wherein the first element isolation portion is formed by a step of forming a first trench in the semiconductor substrate to embed a first insulating film in the first trench.

17. The method according to claim 11, wherein the (f) is performed by an anisotropic etching processing.

18. The method according to claim 17, wherein a distance between a first side surface of the through hole on a first area side and a second side surface of the through hole on a second area side becomes wide in a direction verging toward the back surface side of the semiconductor substrate from the front surface side of the semiconductor substrate.

19. The method according to claim 12, further comprising:
 (j) embedding an embedded member in the through hole between the (f) and the (g).

20. The method according to claim 19,
wherein the embedded member is a resin film, and
wherein the (j) is performed by using an injector.

* * * * *